US007012448B2

(12) United States Patent
Parkes

(10) Patent No.: US 7,012,448 B2
(45) Date of Patent: Mar. 14, 2006

(54) INTEGRATED CIRCUIT AND RELATED IMPROVEMENTS

(75) Inventor: Stephen Maxwell Parkes, Dundee (GB)

(73) Assignee: The University Court of the University of Dundee, Dundee (GB)

( * ) Notice: Subject to any disclaimer, the term of this patent is extended or adjusted under 35 U.S.C. 154(b) by 0 days.

(21) Appl. No.: 10/679,978

(22) Filed: Oct. 6, 2003

(65) Prior Publication Data

US 2004/0124877 A1    Jul. 1, 2004

Related U.S. Application Data

(63) Continuation of application No. PCT/GB02/01407, filed on Mar. 27, 2002.

(30) Foreign Application Priority Data

Apr. 7, 2001    (GB)    .................................. 0108807

(51) Int. Cl.
  *H03K 19/173*    (2006.01)
  *H04L 12/56*    (2006.01)
(52) U.S. Cl. ......................................... 326/41; 326/38
(58) Field of Classification Search ................. 326/38, 326/39, 40, 41
See application file for complete search history.

(56) References Cited

U.S. PATENT DOCUMENTS

| 4,569,041 A | 2/1986 | Takeuchi et al. ............... 370/60 |
| 4,903,260 A | 2/1990 | Boettle et al. ................. 370/60 |
| 5,359,536 A | 10/1994 | Agrawal et al. ............. 364/489 |
| 5,457,410 A | 10/1995 | Ting ............................ 326/41 |
| 5,483,178 A | 1/1996 | Costello et al. ............... 326/41 |
| 5,682,107 A | 10/1997 | Tavana et al. ................. 326/41 |
| 5,815,726 A | 9/1998 | Cliff ....................... 395/800.01 |
| 5,880,597 A | 3/1999 | Lee .............................. 326/41 |
| 5,880,598 A | 3/1999 | Duong ......................... 326/41 |
| 6,072,944 A | 6/2000 | Robinson ............... 395/500.05 |
| 6,084,429 A | 7/2000 | Trimberger .................. 326/41 |
| 6,191,612 B1 | 2/2001 | Agrawal et al. .............. 326/39 |

FOREIGN PATENT DOCUMENTS

| EP | 0 338 558 | 10/1989 |
| EP | 0 360 540 | 3/1990 |
| EP | 0 867 820 | 1/1998 |

(Continued)

OTHER PUBLICATIONS

Parkes, "Space Wire: Links, Nodes, Routers and Networks" ECSS-E-50-12 Space Engineering pp. 1-101, Jun. 2000.

(Continued)

*Primary Examiner*—Daniel Chang
(74) *Attorney, Agent, or Firm*—Winston & Strawn LLP

(57) ABSTRACT

An improved integrated circuit and a related system apparatus and method. The integrated circuit includes a plurality of logic area or user logic areas; and an actively switchable network capable of selectively connecting at least one logic area with another logic area. In particular, the plurality of logic areas include an array of logic-gates or logic-blocks or custom logic which form functional blocks. The integrated circuit can provide a chip-architecture where the functional blocks are specific hardware functional blocks, hardware functional blocks that are parameterized, and/or programmable functional blocks including programmable processors. Also, the functional blocks can act as objects requesting and providing services to other objects on the actively switchable network so that, when a functional block is a programmable processor, the functional block optionally implements objects, with the programmable processor making one, some or all objects thereof visible to other objects connected to the actively switchable network.

40 Claims, 13 Drawing Sheets

FOREIGN PATENT DOCUMENTS

| | | |
|---|---|---|
| EP | 0 969 631 | 1/2000 |
| EP | 1 096 736 | 5/2001 |
| JP | 060118141 | 6/1985 |
| JP | 4151854 | 5/1992 |
| JP | 010255347 | 9/1998 |
| WO | WO 95/04404 | 2/1995 |
| WO | WO 98/02822 | 1/1998 |
| WO | WO 02/058355 | 7/2002 |

OTHER PUBLICATIONS

Swamy et al. "OO-VHDL, Extensions to VHDL" IEEE (1995).

Benini et al. "Networks on Chips: A new SoC Paradigm" SOC Designs IEEE (2002).

A. Tsutsui et al., "Special Purpose FPGA for High-speed Digital Telecommunication Systems", NTT Optical Network Systems Laboratories, pp. 486-491, IEEE (1995).

D'Angelo et al., "Modular Design of Communication Node Prototypes" pp. 170-175 IEEE (1997).

Kaptanoglu et al., (XP-000868474) "A new high density and very low cost reprogrammable FPGA architecture" pp 3-12, (1999).

Vranesic "The FPGA Challenge", Dept. of Electrical and Computer Engineering, pp 121-126 IEEE (1998).

Guerrier et al. "A Generic Architecture for On-Chip Packet-Switched Interconnections", Proceedings of the Design Automation and Test in Europe, pp. 250-256, Paris, France, Mar. 2000.

Search Report for Patents concerning "Object Oriented IC Architecture", NERAC, Inc., Feb. 27, 2001, 21 pages.

Search Report for Patents concerning "On-Chip Packet Switching Networks, Etc.", NERAC, Inc., Feb. 27, 2001, 61 pages.

"IEEE Heterogeneous InterConnect (HIC) (Low-Cost, Low-Latency Scalable Serial Interconnect for Parallel System Construction)", IEEE Computer Society, Sep. 21, 1995, 144 pages.

Parkes, "Space Wire: Links, Nodes, Routers and Networks" ECSS-E-50-12 Space Engineering pp. 1-101, Jun. 2000.

Swammy et al. "OO-VHDL, Extensinos to VHDL" IEEE (1995), no month.

Benini et al. "Networks on Chips: A new SoC Paradigm" SOC Designs IEEE (2002), no month.

A. Tsutsui et al., "Special Purpose FPGA for High-speed Digital Telecommunication Systems", NTT Optical Network Systems Laboratories, pp 486-491, IEEE (1995), no month.

D'Angelo et al., "Modular Design of Communication Node Prototypes" pp. 170-175 IEEE (1997), no month.

Kaptanoglu et al., (XP-000868474) "A new high density and very low cost reprogrammable FPGA architecture" pp 3-12, (1999), no month.

Vranesic "The FPGA Challenge", Dept. of Electrical and Computer Engineering, pp 121-126 IEEE (1998), no month.

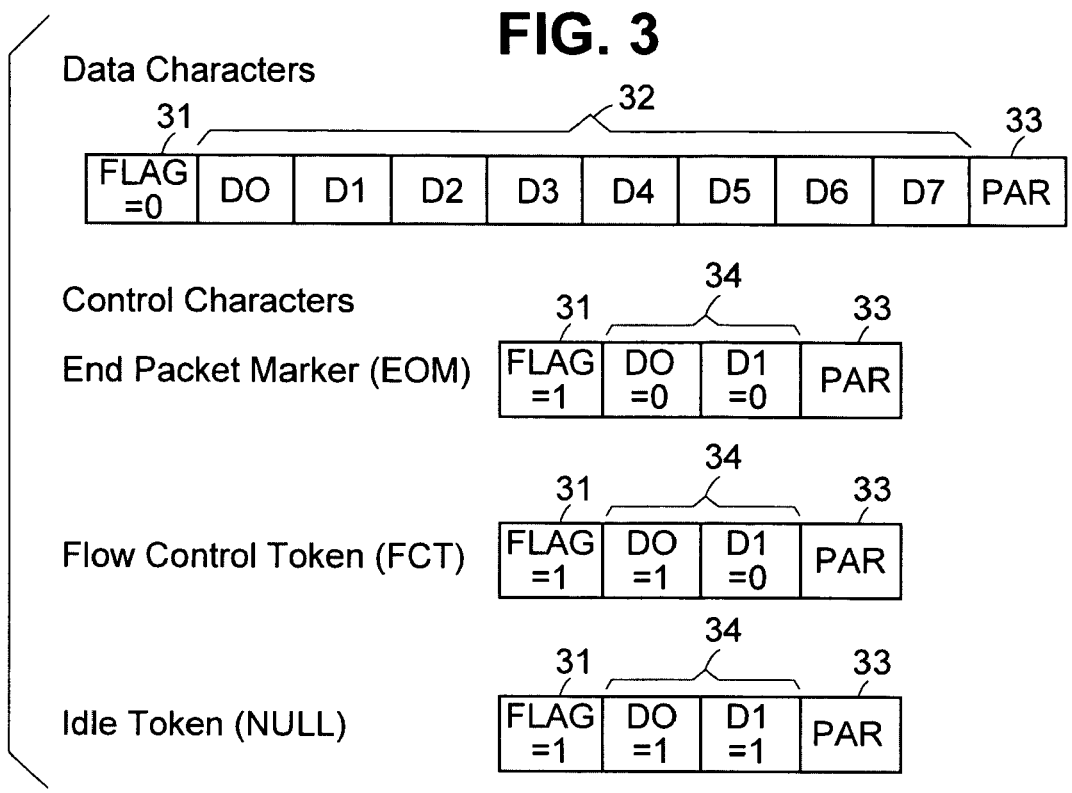
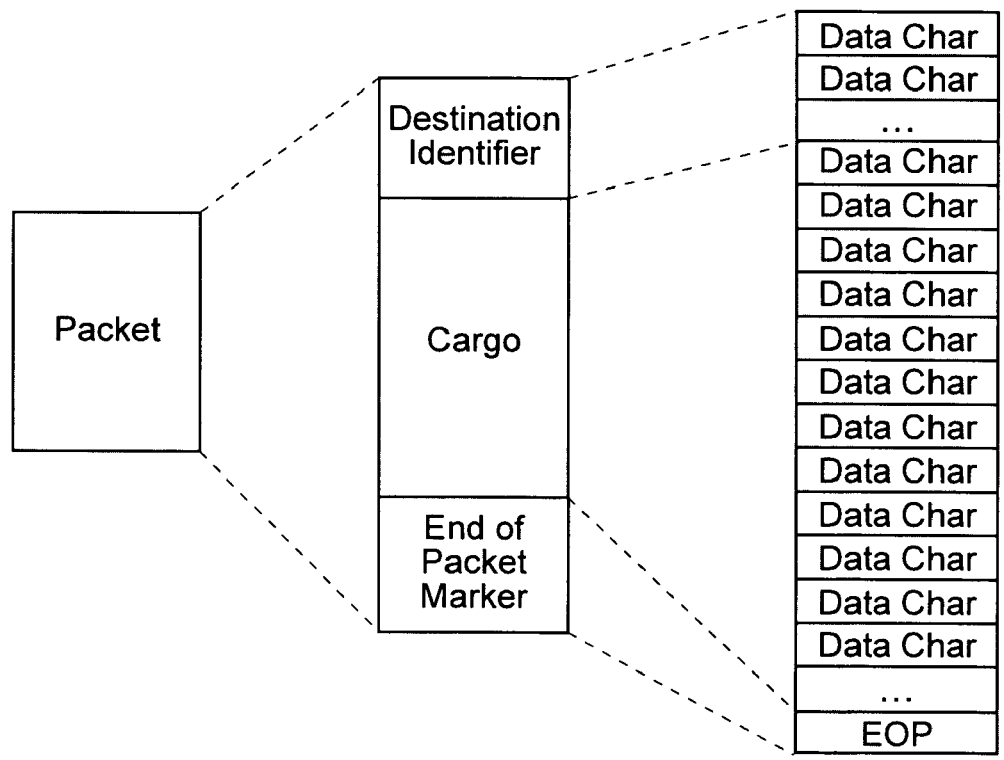

INTEGRATED CIRCUIT AND RELATED IMPROVEMENTS

CROSS-REFERENCE TO RELATED APPLICATIONS

This application is a continuation of International application PCT/GB02/01407 filed Mar. 27, 2002, the entire content of which is expressly incorporated herein by reference thereto.

FIELD OF INVENTION

The present invention relates to an improved integrated circuit (IC), and to a related apparatus and method.

The present invention particularly, though not exclusively, relates to an architecture of a Field Programmable Gate Array (FPGA) or Application Specific Integrated Circuit (ASIC), which includes an on-chip, packet-switching network to facilitate passing of information from one part of the chip to another.

BACKGROUND OF THE INVENTION

FPGAs and ASICs are known electronic components or Achips@ that are customised by the electronic engineers to provide some required chip functionality. FPGAs typically comprise an array of low-level programmable logic function blocks and a programmable routing-matrix which provides interconnections between these blocks. Connection between two parts of such a chip design is provided by routing a logic signal from a source part of the chip to a destination part. The routing resource used is then dedicated to providing this particular interconnection. It cannot be used for anything else unless the FPGA device is reprogrammed, in which case the original signal no longer uses that routing resource.

ASICs typically comprise an array of logic gates. The interconnections between the gates are provided by metal or polysilicon interconnection layers determined when the device is manufactured. Interconnections are therefore fixed at the time of manufacture and cannot be altered.

As the number of logic gates (or blocks) that can be integrated onto a single chip increases, so the number of interconnection layers has to increase to provide adequate routing resource. This increases the cost of the device. The burden on the design tools that place and route the required logic onto the gate and routing resources of the chip also increases.

In view of the above, there is a need for an FPGA and ASIC architecture which can directly support large designs, providing an appropriate level of interconnection, without having to increase the number of interconnection layers and without placing additional burden on the place and route tools.

"Objects" are known constructs used in object-oriented software analysis, design and programming. An object encapsulates data (which represent the state of the object) and the operations that modify or report the values of the data variables within the object. The operations form the interface to the object. A system is typically made up of many objects which interact to provide the required system level functionality. Each object will supply services (perform operations) requested by some other objects and further request services of other objects. The requests for services and the results of these services are communicated between objects by passing messages from one object to another. Object-oriented software design has been successful for software developments because the objects used reflect those in the real world, providing an intuitive basis for abstraction and reasoning about complex systems. There is a need for a new chip-architecture that directly supports the implementation of objects in hardware.

It is an objective of the present invention to seek to obviate or at least mitigate the aforementioned problems in the prior art.

It is also an objective of the present invention to seek to address the aforementioned needs in the art.

SUMMARY OF THE INVENTION

According to a first aspect of the present invention there is provided an integrated circuit (IC or "chip") comprising:
  a plurality of logic areas, eg user/application logic areas; and
  an actively switchable network selectively connecting one logic area with another logic area.

In this way the IC provides an architecture whereby one logic area may controllably communicate with another logic area, thereby providing intra-chip communication.

Herein the term actively switchable network is meant to include networks where communication resources are actively shared between many logic areas that wish to communicate and where logical connections switch rapidly according to the communication needs at any particular time of the logic areas sharing the communication resource. It does not include networks where a permanent or semi-permanent connection is made to connect or transmit individual signals or single data bits between specific areas of logic as used, for example, in current field programmable gate array (FPGA) devices.

The plurality of logic areas may be areas of logic used to implement an application system with different components or parts of the application system being implemented in one or more user logic areas, and being interconnected as required by the application through the actively switchable network.

The integrated circuit may be fabricated in a semiconductor material or semiconductor based material, e.g., Silicon (Si).

A given logic area may comprise a single physical area of the integrated circuit or may comprise a plurality of discrete areas of the integrated circuit. The plurality of logic areas may comprise an array of logic-gates or logic-blocks, which may form functional blocks.

The actively switchable network may comprise an on-chip packet switching network. The packet-switching network may include interfaces for connecting functional blocks to the network, routing switches, and point-to-point links between interfaces and routing switches and between routing switches and other routing switches.

Required functional blocks are implemented using the logic areas. Signals are effectively connected between functional blocks by taking a present value of one or more signals at a source functional-block, packing these value(s) as data into a packet cargo and sending a packet across the on-chip network. A header for the packet is set to contain a location of a destination functional-block. When the packet arrives at a destination, appropriate signals within the destination functional block are set to values defined in the packet cargo.

Each network interface may contain a means of packing signals into packets, a transmitter for sending packets, a receiver for receiving packets and a means of extracting signal(s) from the packet.

The packet-switching network may transport(s) packets from an interface connected to signal source(s), across selected links and routing switches making up the network, to an interface connected to a signal destination functional block. Each packet may comprise a header, a cargo and a delimiter. The header may define a location of the destination for the packet. The cargo may contain data or signal values to be sent across the network. The delimiter may separate one packet from another.

Packets may be delimited by a start of packet marker or by an end of packet marker. The start of packet marker and/or end of packet marker are special codes added by a link transmitter at a start or end of a packet that a link receiver recognizes. Alternatively packets can be sent without a delimiter in which case either packets may all be of a known fixed length or information may be added to a packet header, which details a length of a packet.

Many packets originating from different functional sources and travelling to different functional block destinations, can be sent over the individual links and routing switches of the network enabling relatively few physical connections to connect therebetween (many functional block signal sources to many functional block signal destinations). A temporary connection between at least a pair of functional blocks may be referred to as a virtual circuit.

Where there is more than one link connecting a pair of routing switches, the links may comprise equivalent routes for a packet, so any one of the links may be used to forward a packet. This may be useful when a new packet arrives at a routing switch to be sent to a particular destination. If one link is already busy sending another packet then the newly arrived packet can be sent out of one of the other equivalent links.

Preferably the actively switchable network may be selected from a construction comprising:

a network that switches packets of information using routing switches arranged in a substantially regular grid;

a network that switches packets of information using routing switches arranged irregularly;

a network that uses a physical location (physical address) of a destination logic area to determine the routing through the network;

a network that uses a name (logical address) of the destination logic area to determine routing through the network where each routing switch has a look up table to translate from the name to an output port that a packet is to be forwarded through;

a network where packet destinations are specified as a route or collection of possible routes through the network;

a network where packets are sent from one routing switch to a next in a ring or loop eventually returning back to a source of the packet. In the latter case a user logic area accepting the packet removes the packet from the loop. This accepting user logic area puts a reply onto the loop so that it moves on round the loop until it arrives back at a source of the original packet where it is received and removed from the loop; and/or a network which uses a combination of routing switch arrays and loops.

Different functional blocks may operate asynchronously or synchronously one with the other. When operating asynchronously, a source functional block may request a service from another functional block by sending the another functional block a message. The source functional block may have to suspend operation until the source functional block receives a response from a requested service or the source functional block may continue doing other operations until the source functional block can proceed no further without a response. When a message arrives at the another functional block or "target block" providing the requested service, the service is actioned and the response returned to the functional block that requested the service. The source functional block may then continue with its operation, requesting and providing services to other blocks as necessary. The functional blocks may operate asynchronously with the only synchronisation between blocks occurring when some exchange of information has to take place.

When operating synchronously, signal values (data) will be transferred from a source functional block to a destination functional block and be held in a synchronisation register. A synchronisation signal will then update the destination functional block with new signal values. Packets of signal values (data) maybe sent to appropriate destinations from all sources that have modified their output values since the last synchronisation signal. Operation may be as follows:

(1) on receiving a synchronisation signal all input signals are updated with new values from the synchronisation register, (2) each logic block then propagates these new input signals through to produce new output signals B this may involve many computation steps performed synchronously or asynchronously within the logic block, (3) once computation within a logic block is complete the new output signal values are put in packets and sent to required destination blocks, (4) the synchronisation signal is asserted and the process continues.

A single synchronisation signal may synchronize many logic blocks. The only requirement is that the computation and distribution of new signal values must be complete before a next time the synchronisation signal is asserted. Several different synchronisation signals may be used in a chip, with the period of the synchronisation signal being matched to the required performance of each logic block. The synchronisation period must be long enough to allow all the relevant signals and data to be transferred in packets to their required destinations before the next synchronisation signal.

In a modification the integrated circuit may provide a chip architecture including an actively switchable network which is extended off-chip to provide for inter-chip communication or chip to chip interconnection. An off-chip extension of the on-chip network may use single-ended or differential signaling for a link between the chip and another chip(s). The off-chip extension may also incorporate error correction/detection coding within each packet.

Preferably, the integrated circuit provides a chip architecture in which an interface to the functional-blocks takes the form of an operation identifier, followed by a set of parameters. Each functional block may implement one or more operations. The operation identifier selects which operation a functional-block is to perform. The set of parameters contains those pieces of information (data or signal values) that an operation requires in order to fulfill a task thereof. Thus distinct functional-blocks or "objects" with well-defined functionality, collaborate to provide required system-level functionality. Each object provides specific functionality, defined by the operations supported thereby. Collaboration between the objects is supported by message passing between objects to allow one object to request an operation (or service) from another object. The infrastructure to support message passing is provided by the on-chip network. Operation requests and associated parameters may be transformed by the network interface to the signals and data values that the functional-block (object) needs to carry out the requested operation.

A message may be either a service request or a reply to a service request. A service request message may comprise source and destination object identifiers, operation identifier, and parameters. A reply may comprise source and destination identifiers, operation identifier and result data or acknowledgement.

Each message may be placed in a single packet or a message may be split over several smaller packets.

Preferably, the integrated circuit provides a chip-architecture where the functional-blocks may be specific hardware functional blocks, hardware functional blocks that are parameterized, or programmable functional blocks including programmable processors. When a functional-block is a programmable processor functional block, the functional-block may implement many objects. The programmable processor may make one, some or all objects thereof visible to other objects connected to the on-chip network.

Preferably, the integrated circuit provides a particular object (or logic) that is responsible for receiving requests for services and for providing the address of an object that can provide the required service.

Preferably, the integrated circuit provides an object cache where an object can be loaded temporarily when required to perform a service and moved to an external memory when services are no longer required.

Preferably, error detection and/or correction (e.g. parity, cyclic redundancy check) may be added to data/control characters or packets to improve reliability in situations where there may be single event upsets within the chip.

Preferably, to reduce power consumption a link may be stopped when it no longer has any information to send. The link only sends data or control characters when there are characters to send otherwise the link is not active.

According to a second aspect of the present invention there is provided a system or an apparatus including an integrated circuit according to the first aspect.

According to a third aspect of the present invention there is provided an assembly comprising at least two integrated circuits according to the first aspect, including means for transferring data between the at least two integrated circuits.

According to a fourth aspect of the present invention there is provided a method of intra communication in an integrated circuit comprising the steps of:
  providing an integrated circuit (IC) comprising:
  a plurality logic area; and
  an actively switchable network selectable connecting one logic area with another logic area;
  selecting a source logic area from the plurality of logic areas;
  selecting a destination logic area from the plurality of logic areas; encoding data from the source logic area as a data packet;
  transmitting said data packet from the source logic area to the destination logic area via actively switchable network;
  decoding the data at the destination logic area from the data packet.

According to a fifth aspect of the present invention there is provided an integrated circuit ("chip") having an architecture comprising arrays of logic-gates or logic-blocks (logic-areas) and an on-chip packet-switching network.

According to a sixth aspect of the present invention there is provided an integrated circuit ("chip") that has interconnections between different areas of the chip provided by one or more serial links. Such areas may comprise areas of user/application logic separate from a network that is interconnecting these user/application logic areas. At one end of the serial link the values of several parallel signals or data are loaded into a transmit shift register and transmitted serially along the serial link. At the other end of the serial link the data is received in a receive shift register and unloaded to reconstruct the values of the several parallel signals. In this way many signals are transferred over few wires or tracks from one part of the chip to another part.

BRIEF DESCRIPTION OF THE DRAWINGS

Embodiments of the present invention will now be described by way of example only, and with reference to the accompanying drawings, which are:

FIG. 3 diagram of a network interface a format of data and control characters for the IC of FIG. 1;

FIG. 4 an example packet structure for the IC of FIG. 1;

DETAILED DESCRIPTION OF THE PREFERRED EMBODIMENTS

On-chip Network

Figure 1:
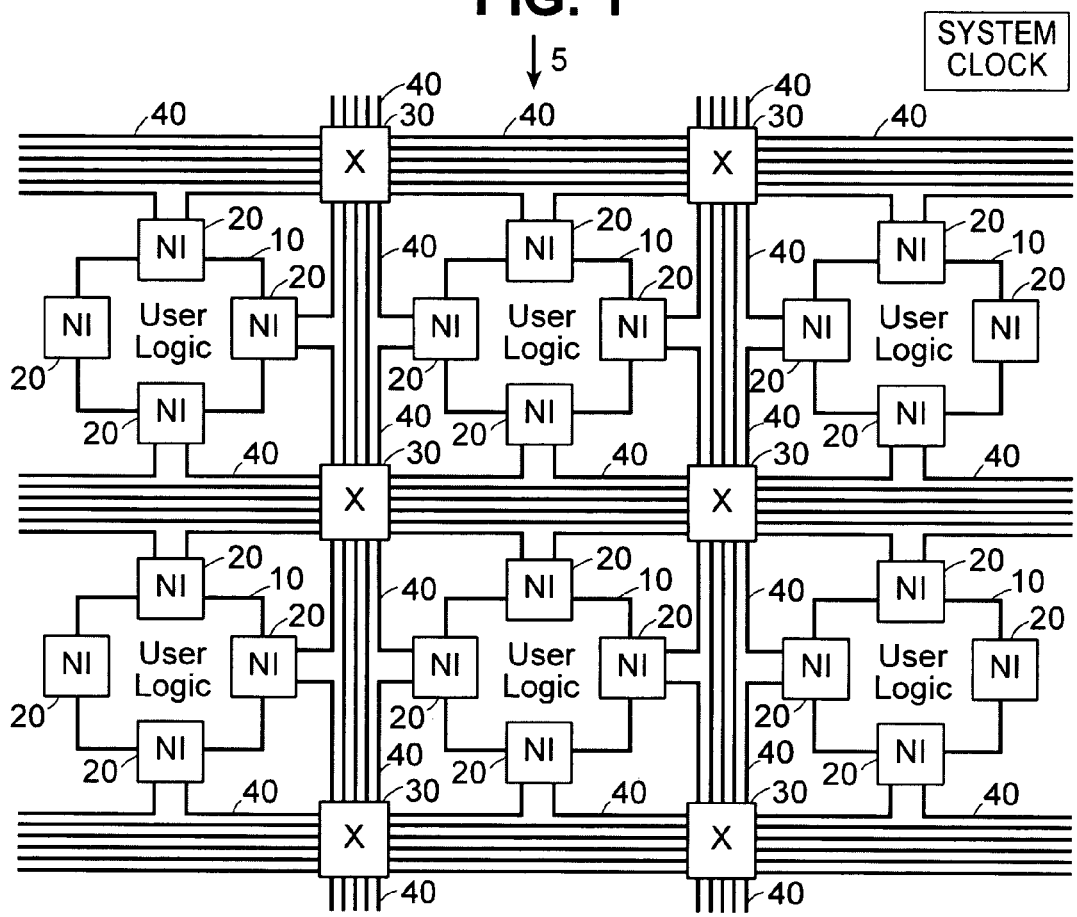
FIG. 1 a schematic overview of an integrated circuit (IC) including an on-chip network according to an embodiment of the present invention.

Referring initially to FIG. 1, there is illustrated an integrated circuit (IC), generally designated 5 according to the present invention. The ICs comprise: a plurality of logic areas or user logic areas 10; and an actively switchable network capable of selectively connecting at least one logic area 10 with another logic area 10. The actively switchable network is an on-chip network which comprises network interfaces 20 between the user logic areas 10 and the on-chip network, routing switches 30 and physical links or tracks 40 that connect the routing switches 30 to the network interfaces 20 and to other routing switches 30. The on-chip network is built into a gate array or FPGA device along with arrays of logic gates or logic blocks comprising large areas 10.

Data or signal values from one user logic area 10 are put into packets by a network interface 20 attached to the area of user logic 10. The packets are then transferred across the network over physical links 40 and through routing switches 30 until reaching a network interface 20 attached to the destination area of user logic 10. The data or signal values are then unpacked and presented to the destination user logic area 10.

Links 40

Links 40 are full duplex, serial, point-to-point connections comprising four signal wires or tracks, two in each direction. One signal wire or track in each direction carries serialized data and the other carries a clock or strobe signal.

Figure 2:
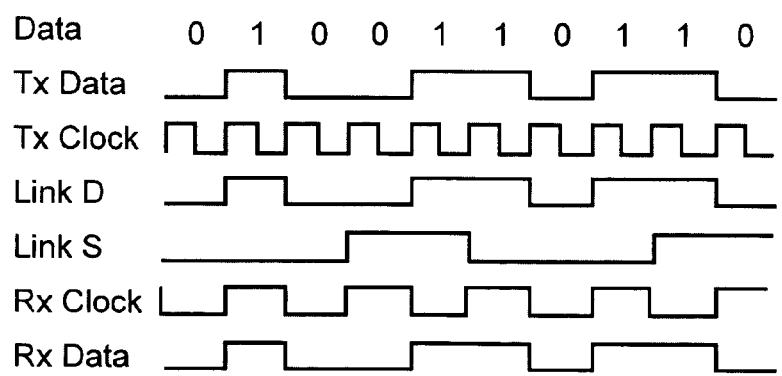
FIG. 2 a data-strobe encoding scheme for the IC of FIG. 1.

In a preferred embodiment is to use the well know data-strobe signalling technique (reference IEEE1355, IEEE1394 and SpaceWire standards) is used. A single data line is used together with a strobe signal, which is derived from a clock signal present in the transmitter which may be derived from a system clock. The strobe signal changes state on a data-clock edge whenever the data signal does not change. The data-clock signal can be reconstructed at the receiving end of the link by XORing together the data and strobe signals. This is illustrated in FIG. 2.

In an alternative embodiment one or more data lines together with a single clock signal, which is the data clock are used.

Uni-directional, half-duplex and multi-drop links are also possible.

Data and Control Characters

Control characters are provided to regulate flow of data along a link (flow control token) and to mark an end of a packet (end of packet marker). In addition an idle token is required to keep the link active when there is no data or other control character to send.

The link has to be kept active because the receiver clock is derived from the data and strobe signals. Stopping the transmitter causes the receiver to stop and any data still in the receiver will be frozen.

It is necessary to distinguish between the three control characters and the data or signal values that are to be sent. This is done using a flag attached to each character to indicate whether it is a data or control character. Data characters hold eight bits of data (eight binary signal values). Data characters comprise a single bit flag that is set to zero to indicate that this is a data character followed by the eight data bits and a single parity bit. Control characters comprise a single bit flag that is set to one to indicate that this is a control character followed by a two control bits and a single parity bit. If the control bits are 00 the control character is an end of packet mark. If they are 01 (where the 1 here is the least significant bit and hence the bit that is transmitted first) the control character is a flow control token. If they are 11 the control character is an idle or NULL token.

Data and control characters are illustrated in FIG. 3.

Packets

Packets comprise a destination identifier, a cargo and some form of delimiter.

<destination identifier> <cargo> <delimiter>

The destination identifier and cargo are constructed from data characters. The preferred embodiment of the delimiter is an end of packet marker.

The destination identifier determines where the packet will be routed. The cargo contains the signal values or data that are to be transferred to the destination user logic. Packets are transmitted serially across the network starting with the destination identifier.

An example packet is illustrated in FIG. 4.

Network Interface 20

Figure 5:
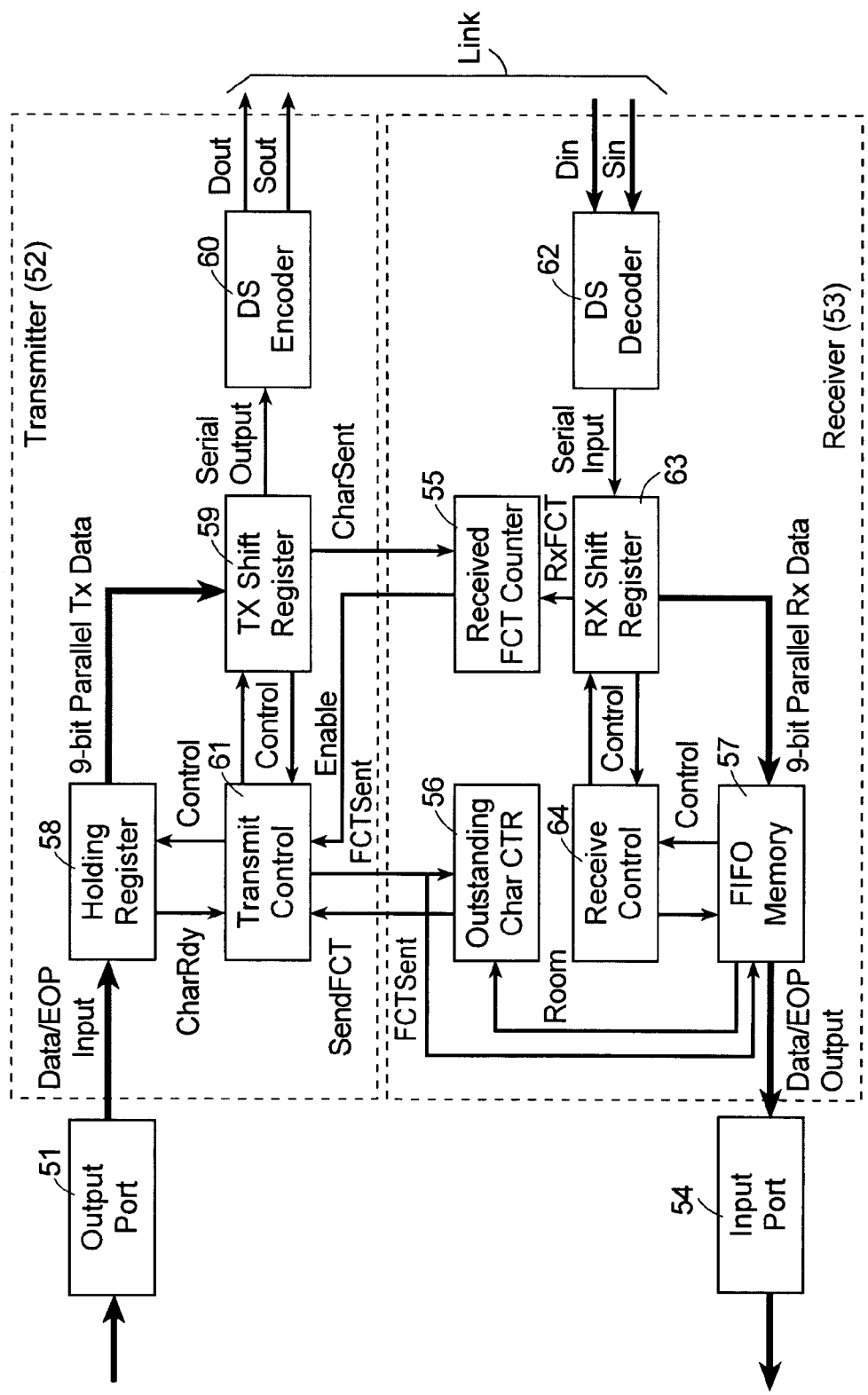
FIG. 5 a schematic block of the IC of FIG. 1.

The network interface 20 connects user logic 10 to the network. The preferred embodiment of a network interface 20 is illustrated in FIG. 5. A network interface 20 comprises an output port 51, a network transmitter 52, a network receiver 53 and an input port 54. The output 51 and input 54 ports connect to the user logic 10. The network transmitter 52 and receiver 53 connect to a link 40 of the network.

The output port 51 takes signal values (data) from the user logic 10 and organises them into a packet adding an appropriate destination identifier and an end of packet marker. It then passes the sequence of data characters making up the packet destination identifier and cargo to the transmitter 52 character by character. When the packet cargo has been transferred, the output port 51 completes the packet with an end of packet marker.

The transmitter 52 takes each data character or end of packet marker passed to it by the output port 51, serializes it by use of the transmit shift register 59, encodes the serial data into data/strobe form by using the data-strobe encoder 60 and sends the serial data stream out of the Data and Strobe outputs (Dout and Sout) of the network link. The transmitter 52 is only enabled to send data when there is sufficient room in the receive buffer at the other end of the link. This is indicated by the Enable signal from the Received FCT counter 55 which keeps track of the number of flow control tokens (FCTs) received and the number of data characters and end of packet markers transmitted. Another counter, the Outstanding Characters counter 56, keeps track of the amount of space reserved in the receive FIFO memory 57 by FCTs that have been sent. If there is room for more than eight more characters in the FIFO memory 57 (indicated by the Room signal) and if the Outstanding Characters counter 56 is not already at maximum count then it will request the transmitter to send an FCT. When the FCT is sent, indicated by the FCTSent signal, the Outstanding Characters counter 56 will be incremented by 8. As each character is subsequently received the Outstanding Characters counter 56 will be decremented by 1. Thus the Outstanding Characters counter 56 indicates the number of characters that have been authorized for transmission by the other end of the link but which have not yet been received. The FIFO memory 57 must keep track of the amount of space that has been reserved for characters by each FCT that is sent. When an FCT is sent the FIFO memory 57 must reserve space for eight more characters.

The transmitter 52 comprises a holding register 58, a shift register 59, a data-strobe encoder 60 and a transmit controller 61. The holding register 58 is loaded with the next character for transmission and holds it until it has been loaded into the shift register. The shift register 59 takes data from the holding register 58 and sends it serially bit by bit out of the serial output. The serial output is encoded into Data and Strobe signals (Dout and Sout) by the Data-Strobe encoder 60. A transmit controller 61 controls the operation of the transmitter 52. The transmitter 52 can send FCTs at any time but can only send data characters and end of packet markers when the transmitter 52 is enabled by the Enable signal from the Received FCT counter 55. This prevents the transmitter 52 sending data characters and end of packet markers until the receiver 53 at the other end of the link has signalled that it has room to receive them by sending an FCT.

The command to send an FCT (SendFCT) comes from the Outstanding Characters counter 56. When the transmit controller 61 receives the SendFCT signal it waits until the current character has been sent by the shift register 59 and then loads an FCT into the shift register 59 for transmission. In this way FCTs are transmitted as soon as possible.

If there is a character waiting in the holding register 58 to be transmitted and there is no FCT to send, then when the Tx Shift Register 59 has finished transmitting its current character, the character in the holding register 58 is loaded into the Tx shift register 59 for transmission. The character in the holding register 58 can either be a 10-bit data character or a 4-bit end of packet marker.

If there is no character waiting in the holding register 58 and no FCT to send then the Tx Shift Register 59 will send idle characters. Idle characters have to be sent so that the receiver clock can continue to be regenerated from the data and strobe signals. Halting the transmitter 52 will halt the receiver 53 and freeze any data in the Rx Shift Register 63.

An alternative to sending a continuous stream of idle tokens when there is no information to send, is to send sufficient idle tokens to allow the receiver to be flushed (i.e. all received data moved to the receiver FIFO memory). After these idle tokens have been sent the link may be halted until there is more information to send. This results in automatic power saving.

When requested FCTs are sent immediately after the current character has been transmitted. Flow control and idle tokens are not counted as characters by the Received FCT counter 55 or Outstanding FCT counter 56 because they are not placed in the receive FIFO memory 57.

The receiver 53 comprises a data-strobe decoder 62, a receive shift register 63, a FIFO memory 57 and a receive controller. In addition the received FCT counter 55 and the outstanding character counter 56 may be considered to be part of the receiver. Serial, data-strobe encoded data arriving at the inputs (Din and Sin) of the data-strobe decoder 62 are decoded into a serial data stream and clock. This recovered clock signal is used to drive much of the receiver circuitry. The serial data is clocked into the receive shift register 63. When a complete character has been received it is transferred to the FIFO memory 57 if it is a data character or end of packet market. If the received character is an idle token it is ignored and discarded. If it is an FCT the received FCT counter 55 is incremented by eight and the FCT is discarded.

Data characters and end of packet markers in the FIFO memory 57 may be read from the input port 54 when the input port is ready for the data. Information in the FIFO memory 57 is held as 9-bit parallel data with one bit following the data/control flag 31. The other eight bits, D0–D7, follow the data bits 32 for a data character, or for an end of packet marker have bits D0 and D1 both set to zero with the other six bits Adon=t care@ values.

The network interface 20 sends a new packet when the signal values going into the output port 51 change or when instructed to send a packet by the user logic 10 that the network interface 20 is attached to. In a modification a global controller could tell each network interface 20 when to send packets. When a new packet is received the signal values going out of the input port 54 are changed to reflect the contents of the packet.

The input port 54 and output port 51 parts of the network interface 20 may be implemented in a number of different ways; register, first-in first-out (FIFO) memory, direct memory access (DMA), or in a combination of these ways.

Figure 6:
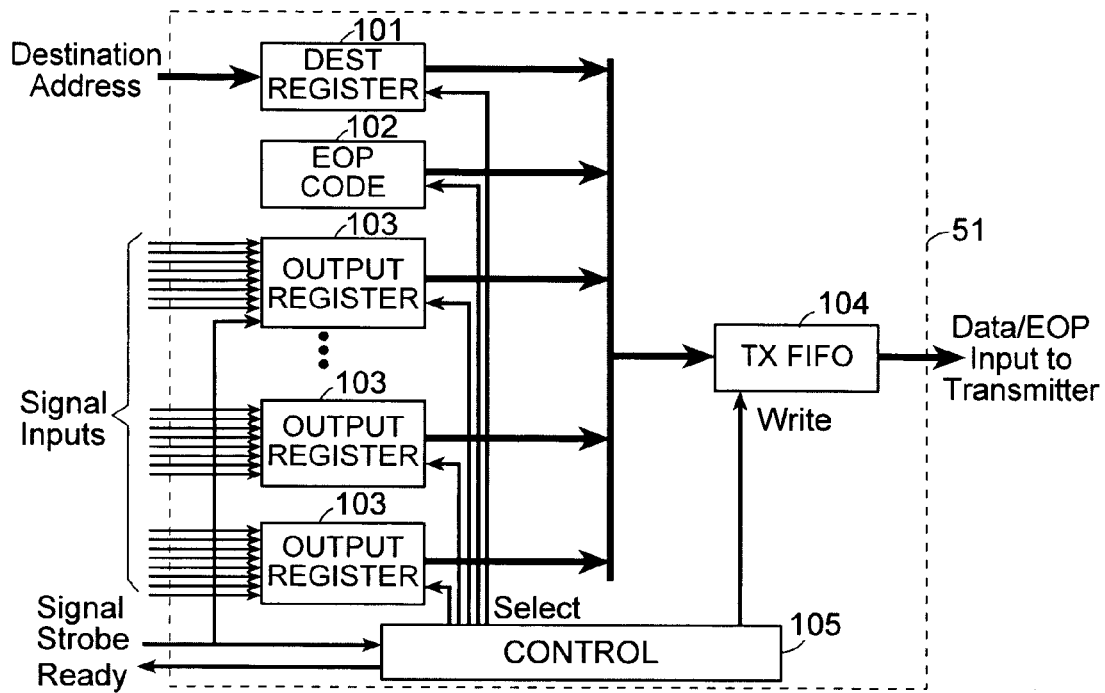
FIG. 6 a register based output port of the IC of FIG. 1.
Figure 7:
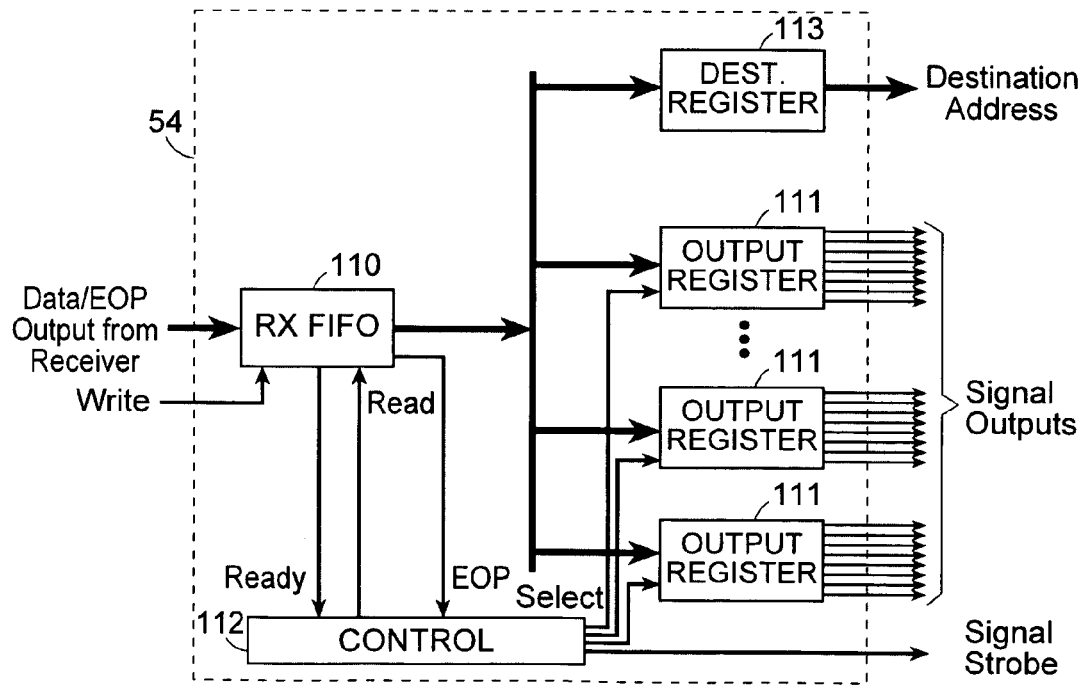
FIG. 7 a register based input port of the IC of FIG. 1.

Register based output and input ports are illustrated in FIGS. 6 and 7 respectively. These would typically be used to connect signals to the network. In FIG. 6, several signal inputs are shown going into the output port 51. A signal strobe is used to indicate that the signal inputs are ready for transfer to a destination functional block. The values of these signals are loaded into registers 103 in the output port when the signal strobe is asserted. A control unit 105 in the output port 51 also receives the strobe signal. When the strobe signal is asserted, indicating that new signal values are ready to be packaged and transferred, the control unit 105 starts to form a packet. It first selects the destination address from a destination register 101 and loads it into the FIFO 104. The destination register 101 is previously loaded with the required destination address, either by the functional logic block 10 attached to the output port 51 or by additional circuitry within the network interface 20. The content of the destination register 101 is the destination identifier of the packet that is to be sent. Once the destination address has been loaded into the FIFO 104 the signal values in the output registers 103 are selected in turn and written into the FIFO 104. When the contents of all of the output registers 103 have been written to the FIFO 104 forming the cargo of the packet, the end of packet marker is added to the FIFO 104 by selecting the EOP Code register 102. Now a complete packet has been written to the FIFO 104. The output port 51 is then ready to accept another set of signal values which it may indicate by asserting a Ready signal. As soon as information has been written to the FIFO 104 it may be read out be the transmitter 52 and transmitted. There is no need to wait for a complete packet to be loaded into the FIFO 104 before transmission starts.

An example of a register based input port is shown in FIG. 7. When data arrives at a register based input port 54 the data characters and end of packet markers are loaded into a FIFO 110 by the receiver 53. A control unit 112 inside the input port reads characters from the FIFO 110. The first characters to arrive will represent the destination address which should be the address of the current input port 54. The characters forming the destination address may either be discarded or may be loaded into to a destination register 113. Following the destination identifier is the packet cargo which holds the signal values or data intended for the input port 54. Each data character is read out and loaded in turn into one of the input registers 111. The complete packet cargo should fill all of the input registers 111 and will be followed by an end of packet marker. The end of packet marker is detected by the control unit 112 which then asserts the Signal Strobe to indicate that a complete set of new data (signal values) are ready in the input registers 111. The end of packet marker is subsequently discarded. The input registers 111 may be double buffered so that all of the Signal Outputs are updated at the same time. Alternatively a pair of handshake signals may be used to control the transfer of information to the destination functional block 10.

The second type of input 54 and output 51 port is the FIFO memory. Data to be transmitted including the destination address and end of packet marker are written by the source functional block to a FIFO. This data is taken from the FIFO by the transmitter 52 and sent to the destination network interface. Data and end of packet markers received by the receiver 53 at the destination are loaded into a second FIFO memory from which they can be read by the destination functional block. With the FIFO type of interface it is up to the source functional block to pack the data to be transferred into packets and to the destination functional block to unpack it.

Figure 8:
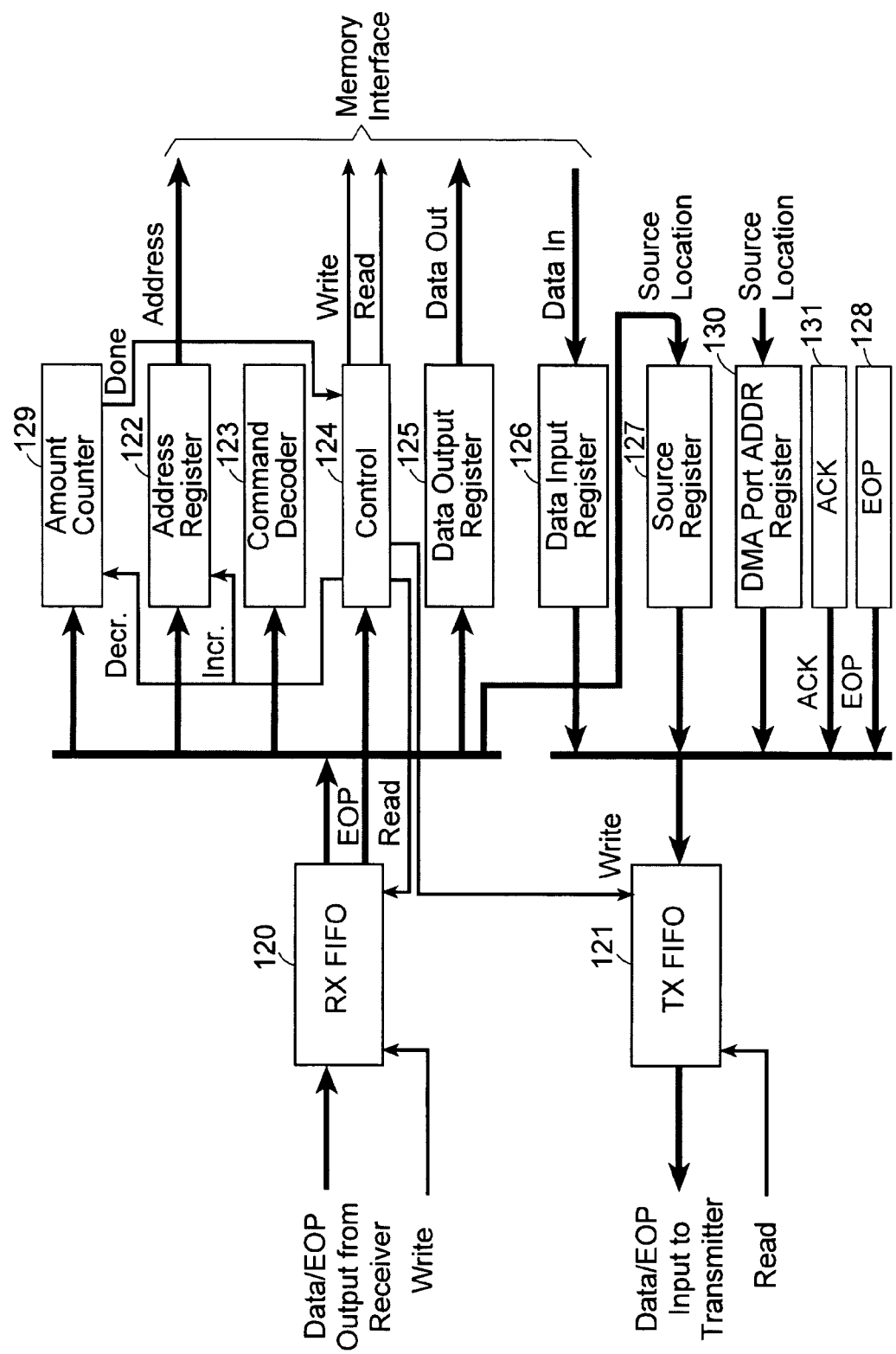
FIG. 8 a DMA based input and output port of the IC of FIG. 1.

The third type of input 54 and output 51 port is direct memory access (DMA). A DMA input and output port is illustrated in FIG. 8. Typically this would be used to interface to some type of memory which may be part of a programmable processor or a stand alone memory block. The DMA port can service two types of request: one to write data to memory and the other to read data from memory. Example packet formats for these requests are:

Write:
<destination id> <source id> <write command> <start address> <data> <EOP>

The DMA interface responds to this command by writing data to memory starting at the specified start address and then may send an acknowledge to the source to indicate that the operation has been completed.

Acknowledge: <destination id> <source id> <acknowledge> <EOP>

Read:
<destination id> <source id> <read command> <start address> <amount> <EOP>

The DMA interface responds to the read command by reading the specified amount of data from the memory starting at the specified start address and sending it in a packet back to the source of the read command.

Reply: <destination id> <source id> <data> <EOP>

The operation of the DMA port will now be described with reference to FIG. 8.

When a packet arrives at the receiver 53 it is passed through the FIFO 120 and read out a character at a time by the control unit 124. Following an EOP the next few characters are the destination id which are discarded. The source id follows and this is loaded into the source register 127 ready to act as the destination identifier for an acknowledge or other reply. After the source id comes the command (either read or write in this example), which is loaded into the command decoder 123, decoded and passed to the control unit 124. Following the command code is the memory start address which is loaded into the address register 122. If the command is a write command then the data to be written follows the start address. As each data character is received it is placed on the memory data interface via the data output register 125 and the contents of the address register 122 is placed on the memory address bus. The memory write signal is then asserted by the control unit 124 to write the data character into memory. The address register 122 is then incremented and the next data character read from the FIFO 120. This process of writing each data character into successive memory locations continues until the end of packet marker is read from the FIFO 120. The write operation is then complete and an acknowledge can be sent to the source of the write command. The acknowledge is formed by writing the contents of the source register 127 to the transmitter FIFO 121 followed by the address of the DMA port 130 which is the source address for the acknowledge packet. An acknowledge code 131 and the end of packet marker 128 complete the acknowledge packet.

If the command received is a read command then the amount of data to be read follows the start address. The amount is loaded into the amount register 129 and then when the end of packet marker is received the DMA port starts to assemble the reply packet containing the requested data. First the contents of the source register 127 are loaded into the transmit FIFO 121 followed by the address of the DMA port 130. The DMA port then places the contents of the address register 122 on the memory address lines and the control unit 124 asserts the read signal to the memory. The memory will then respond by placing the data held at the addressed location on to the data lines. The data is passed through the data input register 126 and loaded into the FIFO 121. Once the data has been loaded into the FIFO the address register 122 is incremented to point to the next memory location and the amount register 129 is decremented. This process of reading data from the memory and placing it into the FIFO 121 continues until the amount register 129 reaches zero indicating that the requested amount of data has been transferred (done signal asserted). An end of packet marker 128 is added to the FIFO 121 to complete the reply packet.

Data Flow

The flow of data across a link must be controlled to prevent overflow of the data buffers in a link receiver. Data flow is controlled using flow control tokens (FCTs).

When a flow control token is received it means that there is room for another N data characters in the receive buffer at the other end of the link. When there is room in the receiver buffer at end A of a link for another N data characters it sends a flow control token to end B. When end B receives the flow control token it can then send another N data characters to end A. Flow control tokens are in effect exchanged for N data characters. This prevents overflow of the receiver input-buffer B a transmitter can only send data if the receiver has room to receive that data. Several flow control tokens can be sent if the receive buffer has room for several lots of N data characters. The receiver must keep track of how much buffer space has been allocated by these flow control tokens and the transmitter must keep track of how many flow control tokens have been received and how many data characters have been sent.

Routing Switch 30

Figure 9:
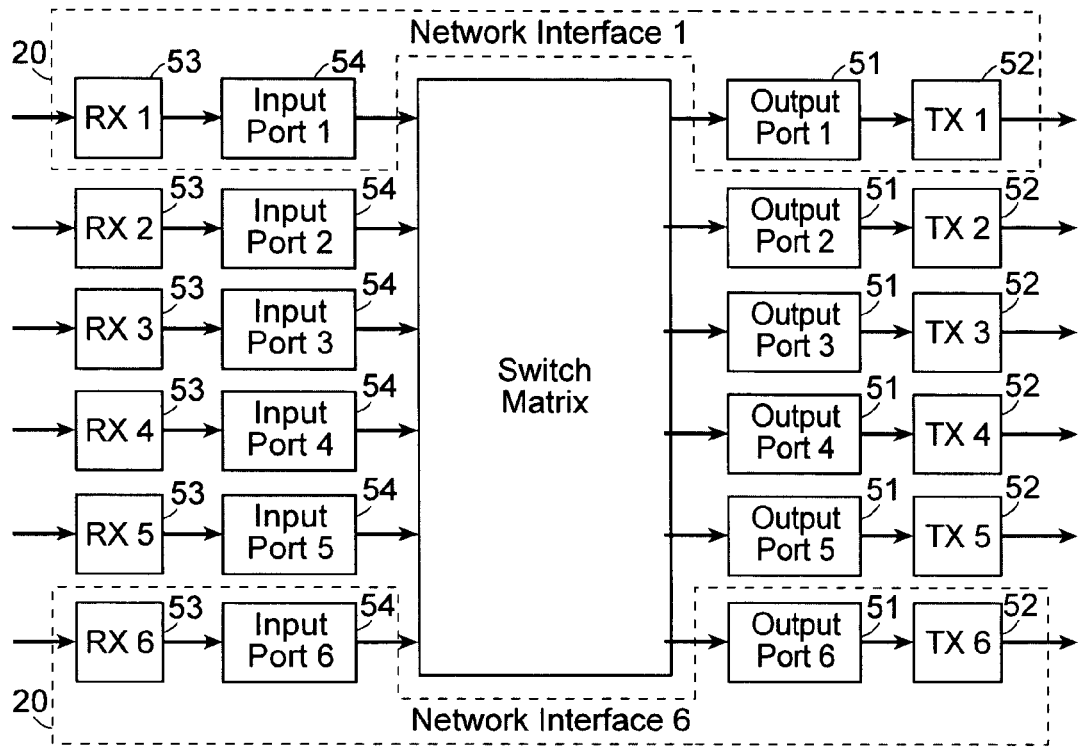
FIG. 9 an example routing switch block diagram of the IC of FIG. 1.

Routing switches 30 contain several network interfaces 20 and a switch matrix 65. A routing switch is illustrated in FIG. 9. The network interfaces 20 can be thought of as comprising an input port 54 (plus receiver 53) and an output port 51 (plus transmitter 52). The switch matrix 65 transfers packets arriving at an input port 54 to an appropriate output port 51 according to the destination address of the packet. When a new packet arrives at an input port 54 its destination address is examined and the set of output ports 51 that could be used to route the packet towards its destination is determined. Of this set of possible output ports 51 some will be busy transmitting other packets from other input ports 54 and some may be able to move the packet closer to its destination than others. The packet will be routed to the output port 51 that is not busy and which gets the packet closest to its destination. Once the output port 51 has been determined the switch matrix 65 is configured to connect the input port 54 to the output port 51 and the packet is transferred. At the end of packet transfer, indicated by the end of packet marker, the output port 51 is freed so that any input port 54 may use it.

If all the possible output ports 51 are busy then the input port 54 must wait for one of them to become free.

Figure 10:
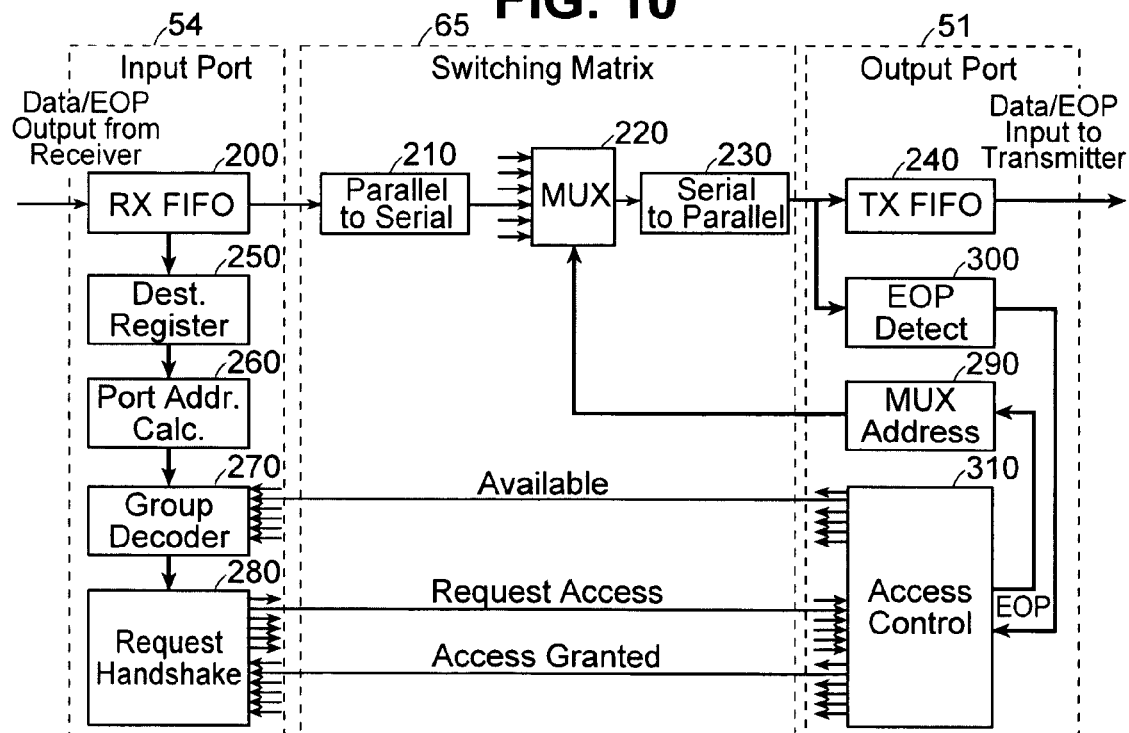
FIG. 10 a more detailed block diagram of the routing switch of FIG. 9.

The operation of an example routing switch 30 will now be described in detail with reference to FIG. 10 which shows a single input port 54, connected via the switch matrix 65, to an output port 51.

Packets arrive from the receiver 53 into the receive FIFO 200 of the input port 54. The destination identifier following an end of packet marker is copied into a destination register 250 and the required output port group is calculated by the port address calculation unit 260. The output port group selected is the set of output ports 51 that will get the packet closest to its destination. The group decoder 270 takes the output port group and checks to see if any of the output ports 51 in that group are available to transfer the packet i.e. are not currently sending a packet. An access controller 310 within each output port 51 produces an available signal which is connected to the group decoder 270 in each input port 54. If one or more output ports 51 in the group are available then one is selected by the group decoder 270 and its address is passed to the request handshake unit 280. The request handshake unit 280 asserts a request line connected to the specified output port 51. This signal to the access controller 310 in the output port 51 that an input port 54 would like to send it a packet. The access controller 310 grants access to the input port 54 by asserting the grant signal for the particular input port 54 and packet transfer can commence. If there is more than one input port 54 that tries to gain access to the output port 51 at the same time then the access controller 310 selects one of them according to some arbitration scheme. When access is granted to the output port 51 the access controller 310 de-asserts the available signal. If an input port 54 has requested access to a specific output port 51 and it sees the available signal for that output port 51 de-asserted when it has not been granted access then it knows that some other input port 54 has gained access. In this case the group decoder 270 selects another of the available output ports 51 in the group to try to gain access to. If there are no available output ports 51 in the selected group then the group decoder 270 can select another group which would get the packet close to the required destination, but may be not as close as the group that was selected first.

When the access controller 310 in the output port 51 grants access to a specific input port 54 it sets up the necessary address in the routing switch matrix 65 to connect the input port 54 to the output port 51.

Once the input port 54 has gained permission to access an output port 51 it can start sending data across the switch matrix 65. The switch matrix 65 is simply a set of multiplexers 220, one for each output port 51. Each input port 54 connects to every output port multiplexer 220. The mux address 290 provided by the access controller 310 commands the multiplexer 220 to select the input port 51 that has been granted access. Data characters are read from the receive FIFO 200 passed through the switch matrix 220 and written into the transmit FIFO 240.

To reduce the size of the switch matrix 65 parallel to serial 210 and serial to parallel converters 210,230 may be placed on either side of the multiplexers 220. In a modification, the FIFO memory 57 in the receiver, the holding register 58 in the transmitter, the TX FIFO 104 and the RX FIFO 110 within a routing switch could all be 1 or 2 bits wide so as to interface directly with a reduced size switch matrix without the need for parallel to serial 210 and serial to parallel 230 converters.

At the end of the packet the end of packet marker will be passed though to the transmit FIFO 240. This is detected by the EOP detector 300 which informs the access controller 310 that the complete packet has been transferred. The access controller 310 then de-asserts the grant signal to the input port 54 and asserts its available signal so that it is ready for use again by any input port 54.

Each output port 51 has one available signal which goes to every input port 54.

Each input port 54 has several request access signals one separately connected to each output port 51.

Each output port 51 has several access granted signals one separately connected to each input port 54.

An alternative implementation of a switch matrix uses a bus for each output port 51. Each input port 54 has a tri-state connection to every output port bus. To make a connection one input port is enabled on to an output port bus.

2D Network and Packet Routing

Figure 11:
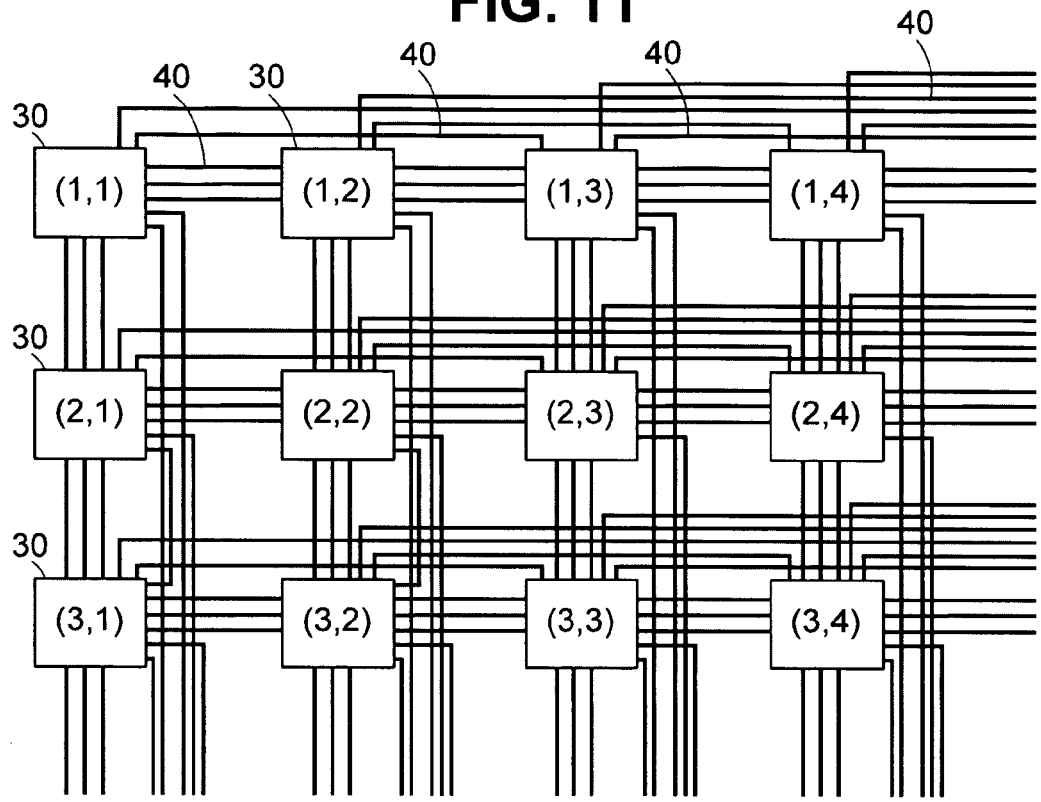
FIG. 11 an example two-dimensional on-chip network of the IC of FIG. 1.

On a chip the preferred embodiment is a two-dimensional network structure. An example is illustrated in FIG. 11. This shows an array of routing switches 30 connected by links 40. The user logic areas 10 are not shown but would be connected to local routing switches 30. There are several links 40 running between each router 30 and its immediate neighbour router 30. There are also links 40 that go further from a router 30 to a neighbour two columns or rows away, and links 40 which run even further covering four, eight or more rows or columns with a single link. The location of a routing switch 30 is given by its row and column number as shown in the diagram. The location of a user logic area 10 is determined by the addresses of its adjacent routing switch 30.

To send a packet from location (1,1) to location (3,4) the packet is addressed with the destination location (3,4) and passed to the nearest routing switch 30. When it arrives at a routing switch 30 the destination address is examined and compared to the address of the current routing switch 30. The packet is sent out of any link in the direction of the destination routing switch 30 that is not currently busy sending a packet. To follow the example, the first routing switch is at location (1,1) so any link going downwards or to the right (in the FIG. 11) will move the packet towards its destination (3,4). A possible route would be (1,1), (1,2), (1,3), (2,3), (3,3), (3,4). This involves five hops from one routing switch to another. Links that cover two or four rows could be used advantageously to reduce the number of hops needed and hence the latency in the packet transfer. For example using a two column link followed by a two row link would lead to the following route (1,1), (1,3), (3,3), (3,4) which takes three hops rather than five. Each routing switch examines the available free (not busy) links and sends the packet out the free link that will get it closest to its destination.

Off-Chip Extension

The on-chip network may be extended off-chip to allow for simple chip-to-chip connection and to support systems that cannot fit into a single device. The preferred embodiment is to use low voltage differential signalling (LVDS) for the signals running between chips. The data and strobe signals may be converted to LVDS directly so that the Data signal becomes Data+ and Data−, and the Strobe signal becomes Strobe + and Strobe−.

Figure 12:
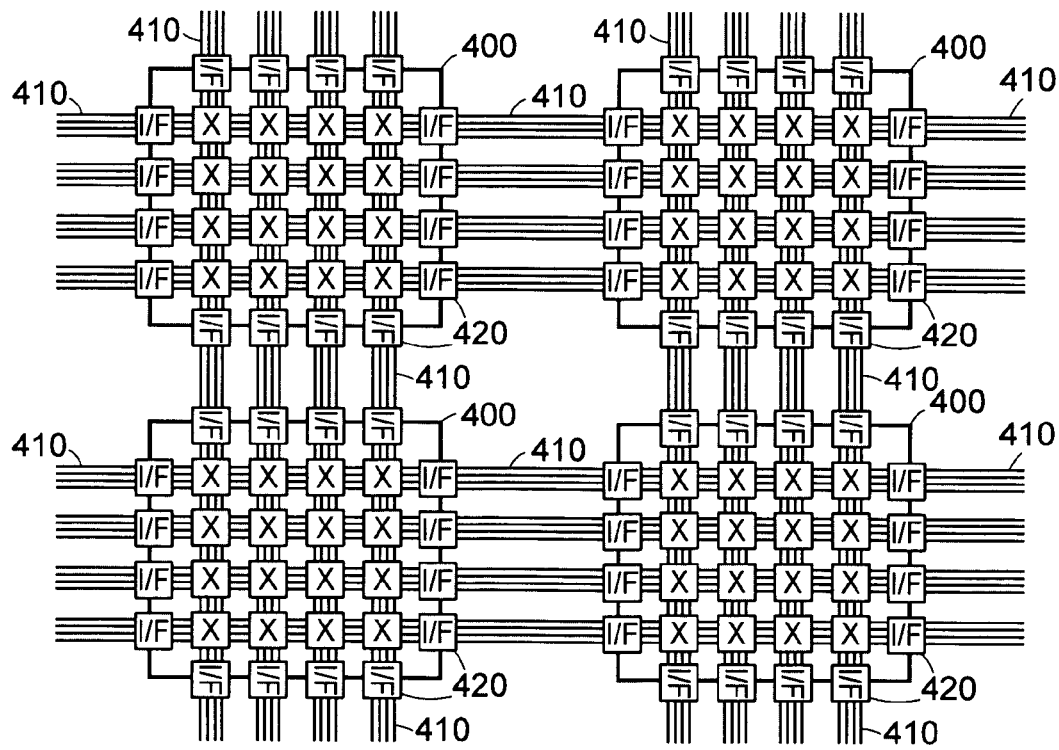
FIG. 12 off-chip extensions to the on-chip network of the IC of FIG. 1.

Four chips 400 are shown connected together in FIG. 12. The on-chip network passes though link interface circuits 420 which provide the LVDS links 410 for connecting chips together. The link interface circuits 420 may also provide error correction coding for the off-chip links 410.

Object

An object is an instance of a functional design that provides a set of clearly defined services or operations. An object has interfaces to the on-chip network so that it can communicate with other objects to request and provide services.

An object type or class is the functional design. An object instance is an instantiation of the functional design i.e. a copy of the functional design implemented in some medium (e.g. logic gates in an ASIC, logic cells in an FPGA, program code in a programmable processor). An object instant has a state which is an abstract representation of the current values of its variables (registers or other storage elements). There can be many instances of a particular object type. For example a convolver object type may be instantiated three times to give three convolver objects each of which can operate independently with their own states.

Objects may be implemented in ASICs, FPGAs or programmable processors. The preferred embodiment will be illustrated using an FPGA as an example.

Before an object instance can be used within an FPGA it must be created. This requires loading the functional design of the object into the FPGA device and setting the variables (registers and other storage elements) of the object instance to specified default settings. The functional design and default variable setting information is typically held in external memory prior to creation of the object instance within the FPGA Each object has
  a type (or class) which is the functional design of the object
  a state which is the current value of its variables (registers and other storage elements)
  an initial state which is the state of the object when it is first created
  a set of services (or operations) that it can provide
  a well defined interface (or signature) to each of the provided services
  a means of communicating with other objects to request services from other objects and to provide the response to services requested by other objects In an ASIC where the design cannot be altered after manufacture the object instances are defined (created) at the time of design/manufacture.

Object Communication

In the present invention objects communicate by sending messages encapsulated in packets across the on-chip network. Thus every object has one or more interfaces to the on-chip network.

Objects may also communicate using other means specific to a pair or group of objects. For example a parallel interface may be used to connect two objects together or a bus may be used to interconnect several objects.

Operation Signature

The operation signature specifies the format of a packet requesting a particular service from an object. An example general format is <destination id> <source id> <operation> <parameters> <EOP>

An example specific format for a read memory operation is

<destination id> <source id> <read memory> <start address> <amount> <EOP>

The destination id is the identity or location of the object that can provide the required memory read service.

The source id is the identity or location of the object that is requesting the memory read service B this is needed so that the data read from memory can be returned to the correct object.

Read memory is the required operation.

Start address and amount are the two parameters necessary to determine which part of the memory is to be read and how much data is to be read.

Each object will provide one or more services. To use a particular service the client object must know the operation signature of the required service so that it can send its service request packet in the appropriate format. The client object must also know the format of the reply to a service request so that it can correctly interpret the information it gets from a service request.

The parameter field in a packet requesting an operation may contain the program code needed to execute that operation on a programmable processor or the logic design information needed instantiate the operation in a general area of programmable logic.

Object Location

An object must know the location of another object in order to request a service from it. This is so that the destination identifier of the packet containing the service request can be set to specify the location of the required serving object. There are several ways in which objects can find the location of another object: design time binding, load time binding, service request broadcast, service provision broadcasting, service broker, object cache.

Design Time Binding

At the time of system design the location of each object is defined. Each object (client) that requires services of one or more other objects (server) is informed of the location of those objects. The locations of serving objects are embedded in each client object and cannot be altered after implementation. This means that all the objects are fixed in place and cannot be moved.

Load Time Binding

With FPGAs or programmable processors the location of each object can be determined when loading the design into a specific device. The circuitry responsible for loading the complete system design can decide where each object is to be located on one or more devices. This will depend on the number of devices and their size and configuration. The loader circuitry maps where the objects will be placed on the target device(s) and then uses this map to specify the connections between objects as they are loaded. The connections are the destination identifiers in each link interface that determine where packets are to be sent. Service request broadcast Objects may be loaded into a target device without the connections being made when the functional design of each object is loaded. Immediately after loading the system will comprise a collection of objects that are not connected together. Connections are made only when they need to be made. One or more objects will start operating after loading and initialization. An operating object (client) will eventually require the services of another object. To obtain these services the client object broadcasts a message to all objects asking for any objects that can provide the necessary service to respond with their location. The client object will select one of the objects that responds to this request to provide the required service and will send it a message requesting the service. The client object may keep the location of the provider of the service in case it needs that service again in future.

Service Provision Broadcast

After loading and initialization of the objects in a device or collection of devices, any object that can provide a service advertises the fact to all the other objects by broadcasting a message stating what services it offers and where it is located. Objects listen for messages containing the location of services that they require and store them for future reference.

Service Broker

One or more special objects are providing whose location is known to all objects (possibly using one of the techniques defined above). These special objects are service brokers that are responsible for making connections between the other objects.

An object (server) that offers any services sends a message to the broker stating the location and type of service offered. An object (client) that requires a service sends a message to the broker asking where a specific service can be found. The broker responds with the location of an object that provides the required service. The client object can then address the server object directly whenever it needs that service. Object cache. In another embodiment, functional blocks (objects) may be held in an external memory and loaded dynamically into an area of reconfigurable programmable logic when they are required. The area of reconfigurable programmable logic acts as a cache for holding the objects when they are being used. An object cache is an area of reconfigurable programmable logic with interfaces to the on-chip network. The object cache typically has room to hold many objects. An object cache controller is responsible for loading objects from an external memory into the cache programmable logic as they are needed. The external memory holding the objects may be accessed directly by the object cache controller or remotely through some form of external communications network.

Figure 13:
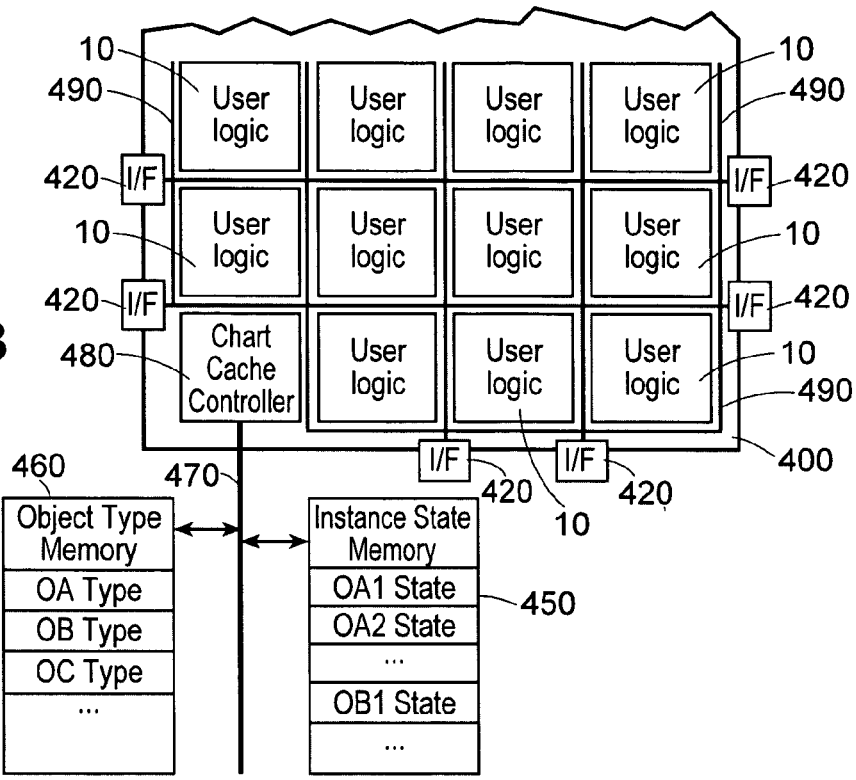
FIG. 13 an object cache of the IC of FIG. 1.

The object cache is illustrated in FIG. 13, which shows an integrated circuit 400 comprising areas of reconfigurable programmable user logic 10, an on-chip network 490 and an object cache controller 480. Attached to the integrated circuit by a bus or network connection 470 is a pair of memories; the object type memory 460 and the instance state memory 450. These two memories may be separate memory devices or they may be different partitions of a single memory device. The object type memory 460 holds the functional logic design information for each type of object that is required in a system. The instance state memory 470 holds the state information for each instance of each type of object. The object cache comprises the array of reconfigurable programmable user logic 10, the on-chip network 490 and the object cache controller 480.

The object cache controller 480 manages the objects in the object cache and in the external memories 460, 470. Objects can only perform operations (provide services) when they are in the object cache. When they are in the external memory they are simply designs waiting to be loaded. Objects in external memory are functional designs waiting to be implemented. These designs are implemented when they are loaded into the object cache.

To create a new object the object cache controller 480 copies the functional design from the object type memory 460 into a free area of user logic 10 in the object cache. It then initializes the state of the object using default state information from the object type memory 460. The cache controller 480 must also reserve space in the instance state memory 450 to store the state information of the newly created object instance in case it has to be removed from the object cache. Finally the object cache controller 480 must update some reference tables (see FIG. 14).

To remove an object instance from cache the object cache controller 480 copies the current state of the object to the space reserved for it in the instance state memory 450 and deletes the object from cache. It then updates its reference tables.

To reload an object instance from external memory into the object cache the object cache controller 480 first loads the appropriate functional logic design from the object type memory 460. It then copies the state information for the required object instance from the instance state memory 450 into the functional design in the object cache. Finally the cache controller 480 updates its reference tables.

Figure 14:
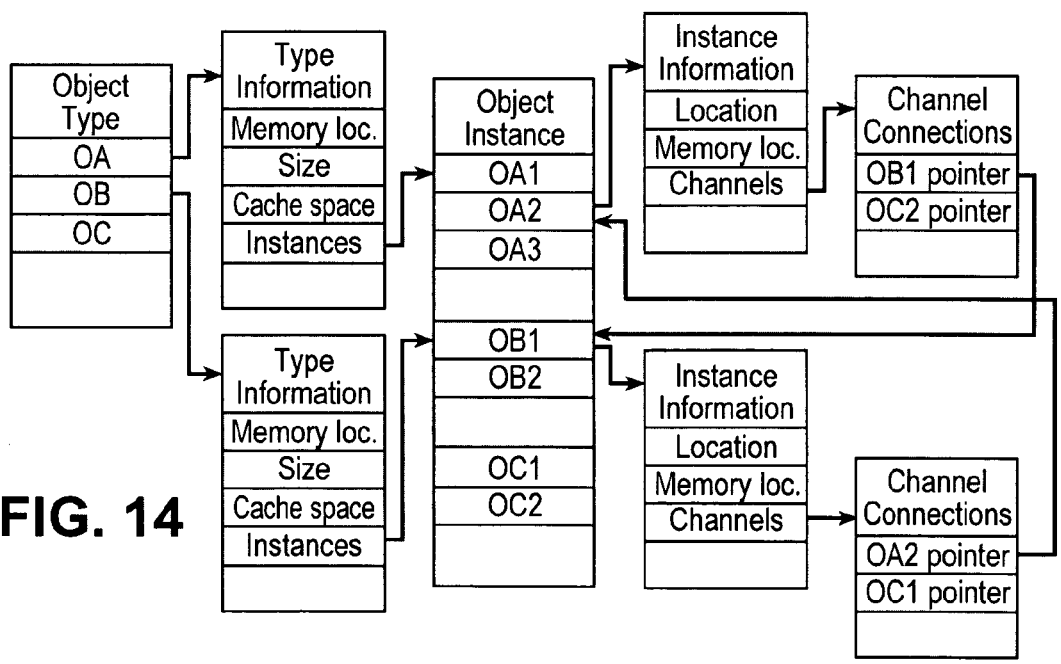
FIG. 14 an object cache reference tables for the object cache of FIG. 13.

The reference tables of the object cache controller 480 are illustrated in FIG. 14. The object type table contains the complete list of object types that are available. Details of each type of object are held in type information tables. For example the location (Memory loc.) of the object functional design information in the object type memory 460, the amount of memory space that the object functional design occupies, and the amount of object cache space that the object will require. The object type information table also contains a pointer to a table of object instances. The object instance table in turn contains pointers to instance information tables, one for each object instance. The instance information tables contain the current location of the instance, the location of the area in the instance state memory reserved for storing the state of the instance and a pointer to an array of channel connections. The channel connection tables contain pointers to each object instance that the present instance is connected to. In FIG. 14 it may be seen that a channel is made up of two connections one in each direction e.g. object A2 being connected to object B1 and object B1 being connected to object A2. The reference tables for the object cache controller may 480 be held in internal or external memory.

When services of an object are required the current contents of the object cache are first inspected to see if the object is available in the cache. If the object is in the object cache, then the object requesting the service (client) and the object that is to provide the service (server) are put in contact (given each others location) by the cache controller. The two objects can then communicate as necessary. If the object is not in the object cache then it must be loaded from external memory into the cache. First the functional logic design of the required object is loaded into a free area of the object cache, then the current state of the object is loaded. If this is the first time that the object has been loaded then its default state will be loaded.

If there is not enough room in the object cache for the required object to be loaded then the object cache controller 480 must free some space in the object cache. It does this by selecting an object which is not currently in use and copies its current state to external memory. The space occupied by the selected object is then free for use by the required object. The space occupied by more than one object may have to be freed in this way before there is sufficient space for the required object.

An object that has been removed from the object cache may be needed at a later time, when some other object requests a service from the removed object. In this case the object has to be reloaded by the object cache controller 480. To do this first its functional logic design is loaded from external memory and then the state information, that was saved when the object was previously removed from the object cache, is loaded. After loading, the object is in the same state as it was before it was removed from the object cache.

The object cache controller 480 interfaces to the on-chip network 490 and the configuration circuitry of the FPGA device, which is responsible for the loading of functional logic design information (object type) into the FPGA.

Management of the connections between object instances is important. A connection between a pair of object instances may be regarded as a channel between them. While the channel exists (is open) the two objects can communication making and responding to service requests as necessary. If one of the two objects is removed from the cache then the communication channel between the objects is broken. An example method for handling this problem will now be described with reference to the object interaction diagrams (sequence diagrams) in FIGS. 15 to 22, which show two objects instances A2 and B1 and the cache controller.

Figure 15:
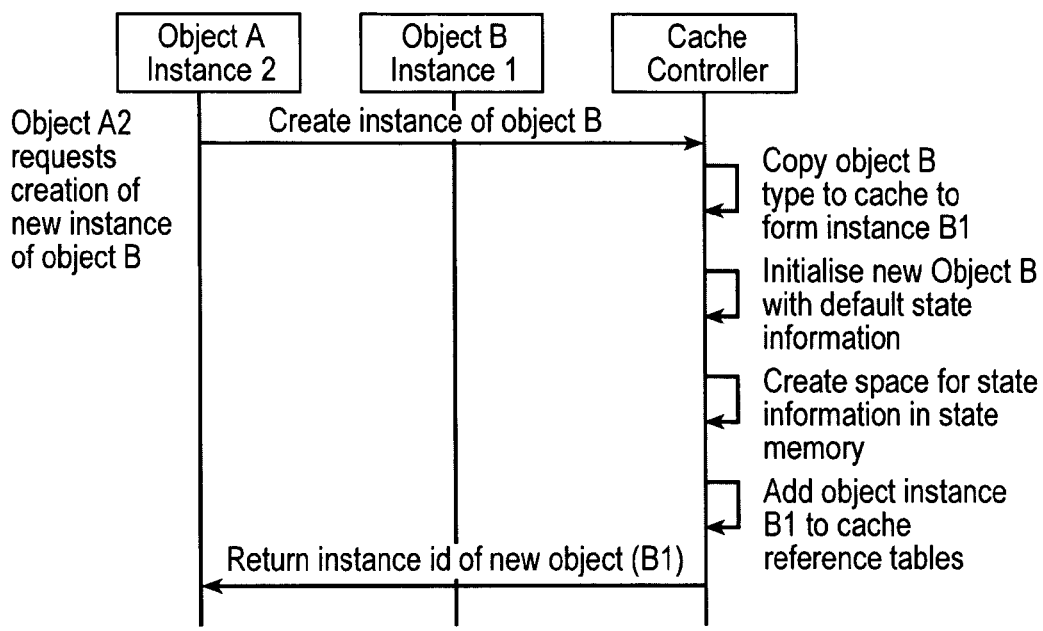
FIG. 15 an illustration of how the object cache of FIG. 13 creates an object.

FIG. 15 shows the process for creating a new object instance. An existing object instance A2 wants to create an instance of object type B. To do this it sends a message (in a packet) to the cache controller 480 over the on-chip network asking the cache controller 480 to create an instance of object B. The cache controller 480 on receiving this request copies the object type information (i.e. the functional logic design) for object B from the object type memory 460 to the cache, forming a new instance of object B. This instance is given a new identifier B1. The new instance of object B is then initialized by loading it with the default state information from the object type memory 460. Space is then created in the state memory 450 to hold the state information for object instance B1. The object instance B1 is added to the reference tables of the cache controller 480 and the instance identity (B1) of the newly created object is returned to object A2, which asked for it to be created.

Figure 16:
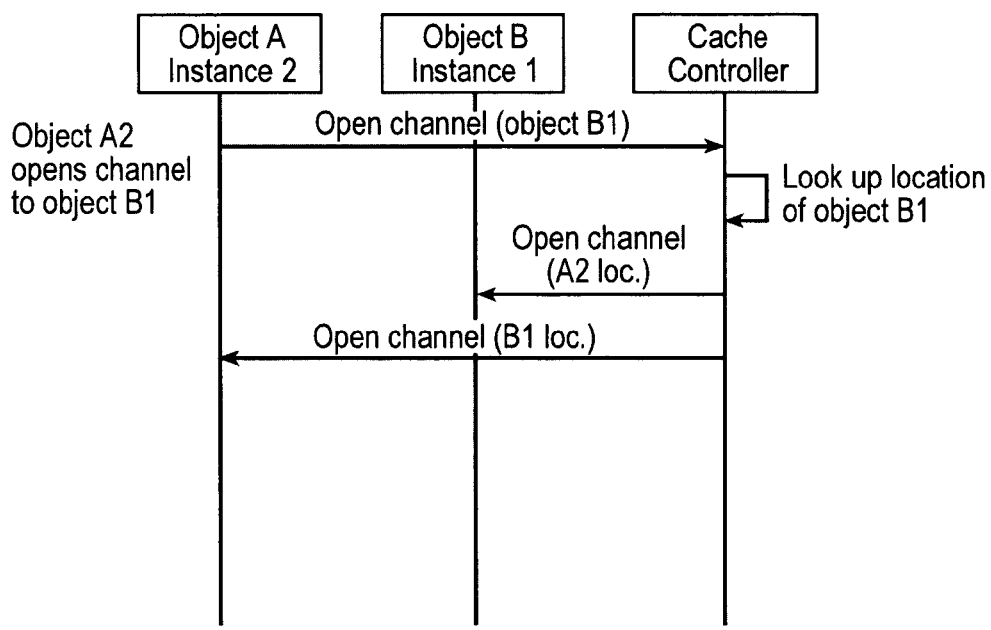
FIG. 16 an illustration of the object cache of FIG. 13 opens a channel.

FIG. 16 shows how an object can open a communication channel to another object. This process is managed by the cache controller 480. Object A2 asks the cache controller 480 to open a channel to object B1. The cache controller 480 looks up the current location of object B1. It then sends a request to object B1 to open a channel to object A2 passing the address of object A2 as a parameter. Finally the cache controller 480 sends a request to object A2 to open a channel to object B1 passing the address of object B1 as a parameter. In this way both objects know the locations of the other object so they are able to communicate.

Figure 17:
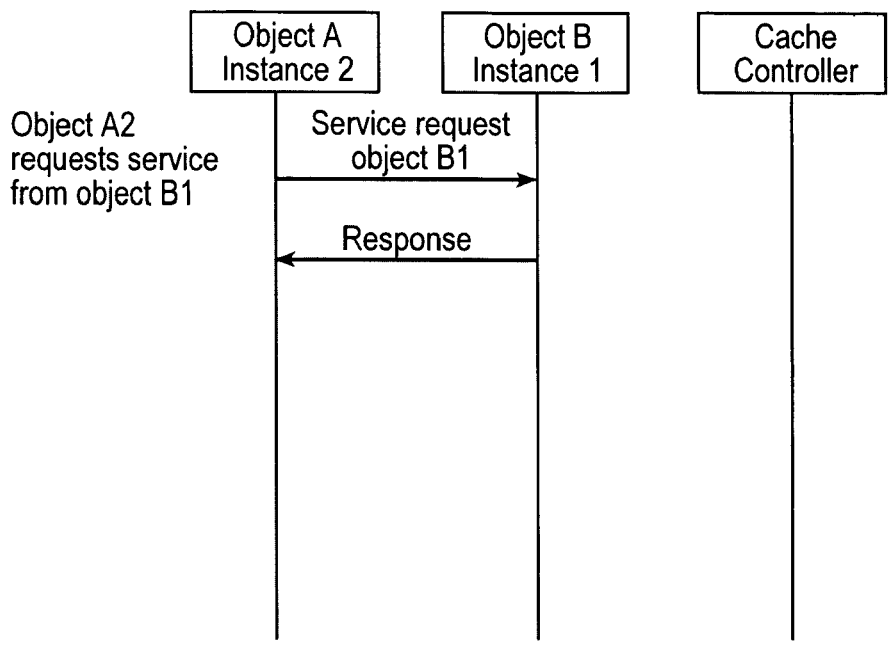
FIG. 17 an illustration of how the object cache of FIG. 13 requests a service from an object in the object cache.

FIG. 17 shows an object requesting and receiving a service from another object. Object A2 requests a service from object B1. Object B1 carries out the requested operation and send the response back to object A2.

Figure 18:
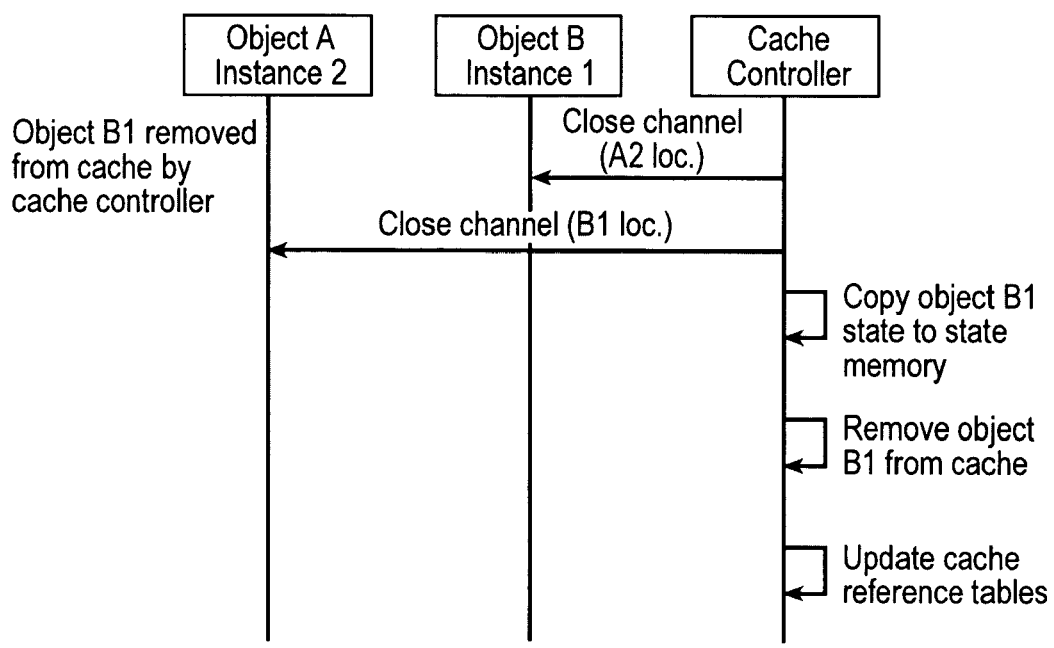
FIG. 18 an illustration of how the object cache of FIG. 13 removes an object from the object cache.

FIG. 18 shows how an object is removed from the cache by the cache controller. The cache controller 480 will need to do this when the object cache is full and it needs to load another object. It must first free some space by removing an object that is not in use (i.e. not currently servicing an operation request). In FIG. 18 the cache controller 480 wants to remove object B1 from the object cache. First the cache controller 480 must close any communication channels to object B1 in case an object wants to communicate with object B1 after it has been removed from cache. The cache controller 480 does this by sending a close channel message to object B1 with the location of an object that B1 is connected to (e.g. the location of object A2 in FIG. 18). Object B1 will then close this channel by altering the channel destination to refer to the cache controller 480. The other end of this channel will also need to be closed by the cache controller 480. It does this in a similar manner by sending a close channel message to object A2 giving it the location of the object B1. Object A2 closes the channel by altering the channel destination to point to the cache controller 480. Now if object A2 requests a service from object B1, the request will be routed to the cache controller 480.

The closing of both ends of a channel will need to be repeated for all the channels connected to object B1. Once the object B1 has been disconnected from all the other objects it can be removed from the object cache. First its state is copied to the area reserved for it in the state memory 450 when the object instance B1 was first created. Then the space taken up by the object B1 in the object cache can be freed. Finally reference tables in the object cache will need to be updated to indicate that object B1 is now no longer in the object cache.

Figure 19:
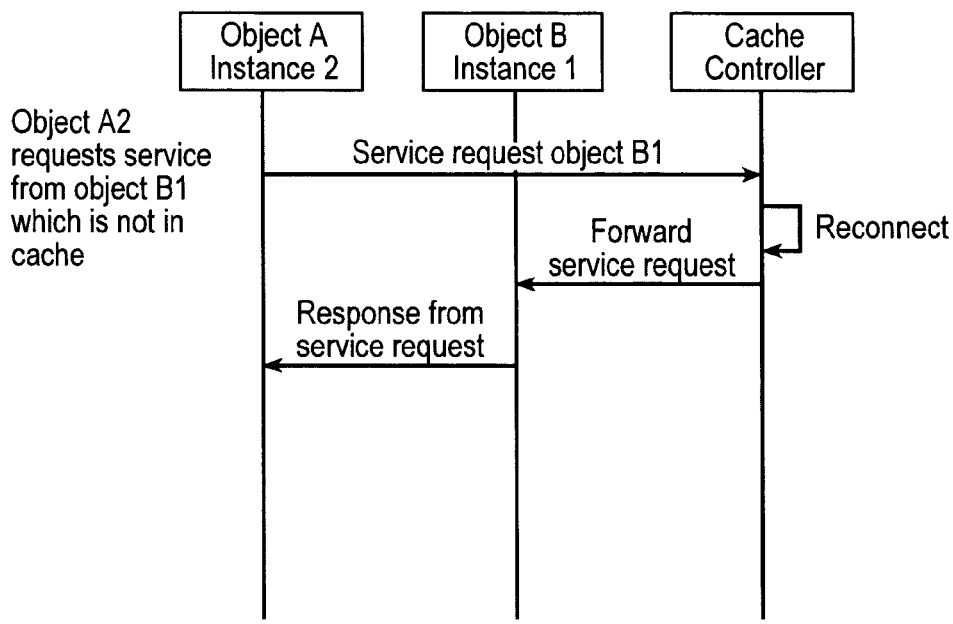
FIG. 19 an illustration of how the object cache of FIG. 13 requests a service from an object not in the object cache.

FIG. 19 shows the procedure that is followed when an object requests a service from another object that is not currently in the object cache. The object must be loaded into the object cache and its channels reconnected so that it can communicate with other objects. In FIG. 19 object A2 requests a service from object B1 which is not in object cache. This message is routed to the cache controller 480 because the reference in object A2 to the object B1 was changed to point to the cache controller 480 when object B1 was removed from the cache (see FIG. 18). The cache controller 480 reloads and reconnects object B1 (see FIG. 20) and forwards the service request from object A2 on to object B1 which is now in the object cache. When object B1 has processed the request it sends the response directly to object A2. It can do this because the source location in the forwarded service request message is the location of object A2 (not the cache controller 480).

Figure 20:
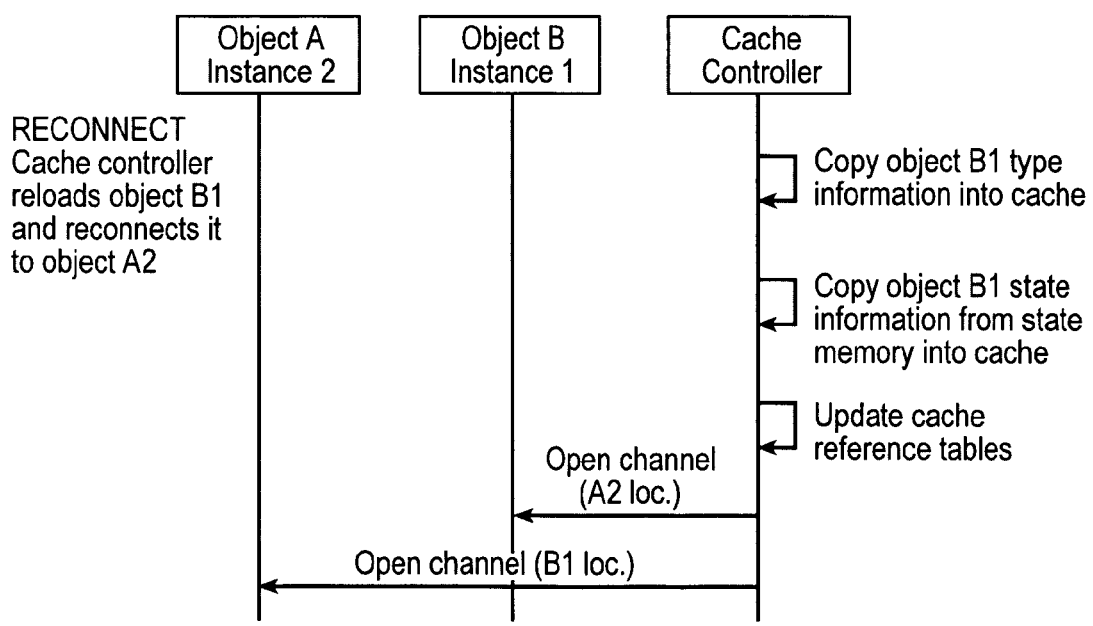
FIG. 20 an illustration of how the object cache of FIG. 13 reconnects a channel between a pair of objects.

FIG. 20 shows the cache controller 480 reloading an object into the object cache and reconnecting its channels. When required to reload an object into the object cache the cache controller 480 checks that there is space for the new object in the object cache (see FIG. 18 for what happens if there is not enough room in the object cache). The cache controller 480 then copies the object type information for object B1 (i.e. the functional design information for a B type object) into the object cache. The state information for object B1 is then copied from the state memory to the newly loaded B type object. This gives the general B type design the identity of the object instance B1. Object B1 is now in the same state as it was before it was removed from the object cache, with the exception of its communication channels which need to be opened. The cache controller 480 updates its cache reference tables to indicate the object B1 is back in the object cache. Finally it sends open channel messages to objects B1 and A2 to update the channel destination identifiers in those objects enabling them to communicate once more.

Figure 21:
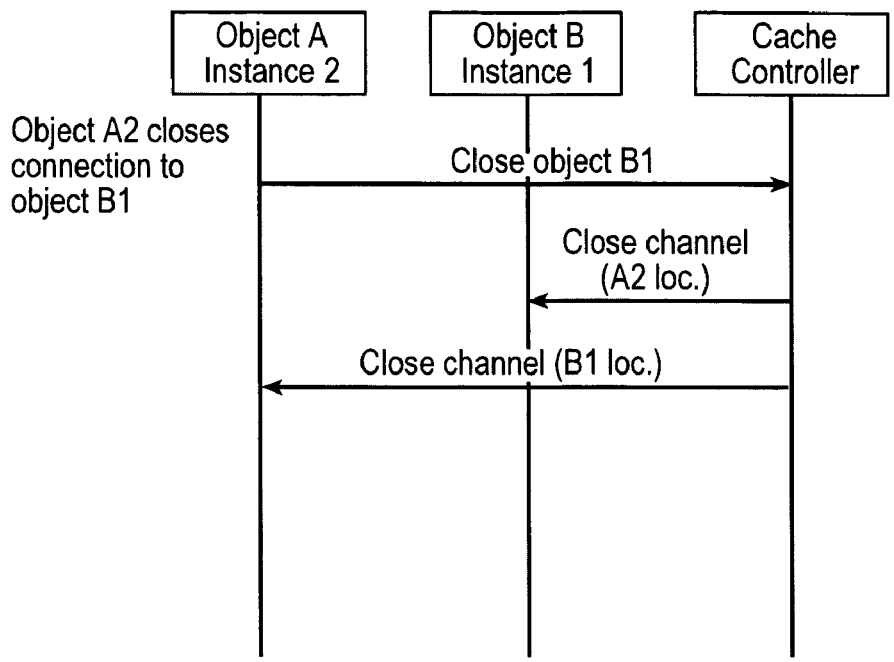
FIG. 21 an illustration of how the object cache of FIG. 13 closes a channel.

FIG. 21 shows how a communication channel is closed once it is no longer needed. Closing a channel after use means that it no longer has to be managed by the cache controller improving cache performance. Object A2 requests the cache controller 480 to close the connection to object B1. The cache controller 480 then sends out close channel messages to objects B1 and A2 removing the channel destination identifiers in each object. For object A2 to communicate with object B1 in future the channel must be opened again first.

Figure 22:
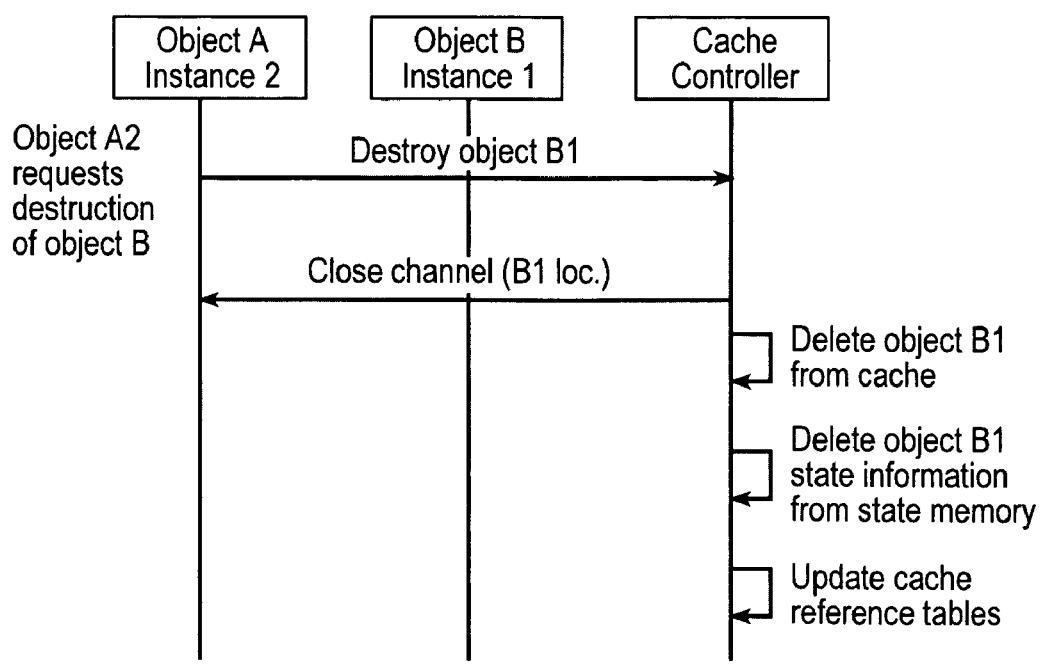
FIG. 22 an illustration of how the object cache of FIG. 13 destroys an object.

FIG. 22 shows the process for destroying an object instance i.e. removing it completely from the system. Object A2 sends a message to the cache controller 480 requesting it to destroy object B1. The cache controller 480 sends a close channel message to all objects that were attached to object B1 so that they are prevented from trying to communicate with a non-existent object. It then deletes object B1 from the object cache and deletes its state information from the state memory 450. Finally the object cache controller 480 updates its reference tables deleting all references to object B1.

In another aspect, an object cache operates with a fixed set of object types (functional blocks). In this case the functional design for each type of object is held permanently in the object cache and the state information for every instance of an object is held in an instance memory. When a service from a particular instance of an object is required, its state information is loaded from the instance memory into the variables (registers and other storage elements) of the functional block. The functional block takes on the role of the particular instance that was loaded. When a service is required from a different instance, the instance state currently held in the variables of the functional block is first copied to the instance memory and then the state of the newly required instance is loaded.

The instance memory may be a common external memory used to hold all instances of a number of different object types (functional blocks) or it may be an area of memory dedicated to holding instances for a particular object type (functional block). In the latter case the instance memory for a particular object type would be implemented close to the functional block so that the state information of the object instances can be saved and retrieved quickly.

There may be more than one object cache controller 480 on a chip where each cache controller controls one or more separate areas of user logic 10.

Programmable Processor Arrays

The preferred embodiment has concentrated on FPGA implementation. Possible embodiments using programmable processors will now be described. Combinations of ASIC, FPGA and programmable processor systems are also possible.

Figure 23:
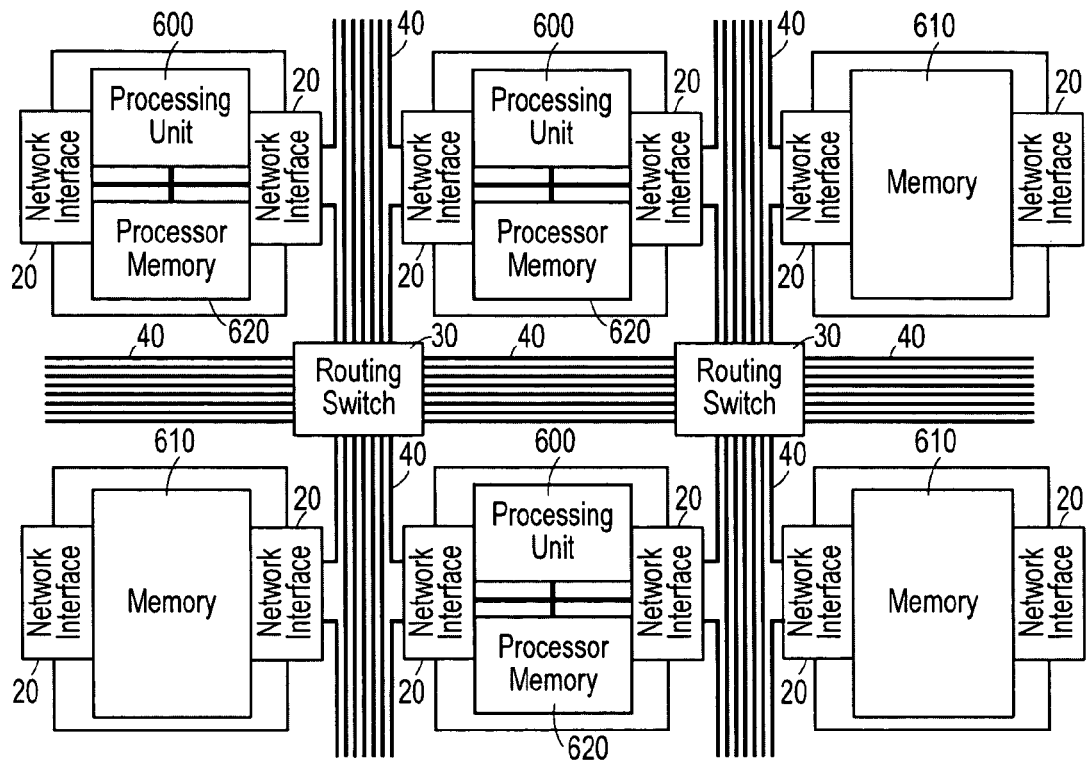
FIG. 23 an array of programmable processors with separate memory objects according to the present invention.

An array of programmable processors 600 may be implemented on a single integrated circuit each with their own area of memory 620 and interfaces to the on-chip network 20, see FIG. 23. The processors 600 communicate sending information across the on-chip network 40. Objects may be implemented in software on any of these processors 600. Common areas of memory shared by two or more processors 600 or between some type of peripheral object and one or more processors 600 may be implemented as separate blocks of memory 610 accessed via the on-chip network 40. Multiple on-chip interfaces 20 to the shared memory block 20 provide multi-port access to that memory 610 where two or more processors 600 or other objects may access the memory 610 at the same time.

Figure 24:
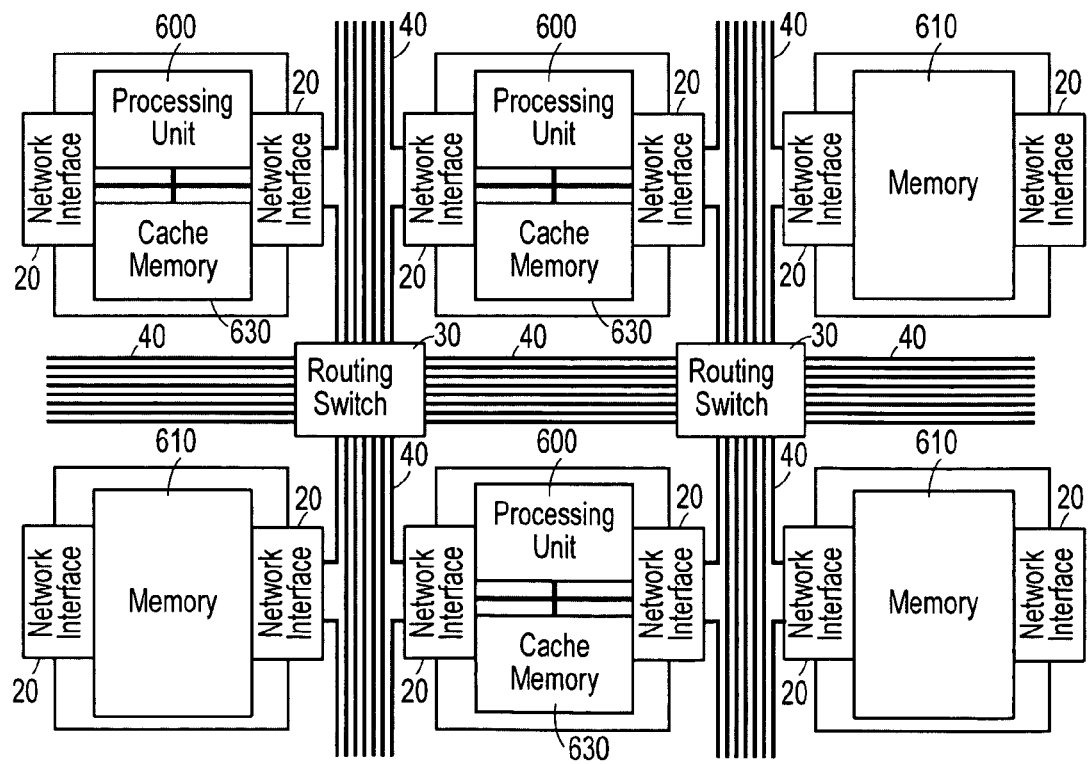
FIG. 24 a programmable processor with local cache only according to the present invention.

Programmable processors 600 often use cache memory close to the processing unit to improve processor performance. In another embodiment, illustrated in FIG. 24, an array of programmable processors 600 only have cache memory 630 and do not have any other memory within the processor unit. Program code and data is stored in separate memory blocks 610 within a device accessed via the on-chip network 40. A processor 600 normally accesses program code and data from the cache memory 630. When there is a cache miss (required information is not in the cache memory) the cache 630 retrieves the required program code or data from a separate memory area 610 using the on-chip network 40. It does this by sending a message to the memory block 610 containing the required program code or data which responds with a packet containing the needed code or data. Program code or data in the cache 630 can be removed by sending it in a packet to the appropriate memory block 610.

It will be appreciated that the embodiments of the presently invention hereinbefore described are given by way of example only, and are not meant to limit the scope thereof in any way.

In particular, it will be understood that although in present preferred embodiments the IC 5 is implemented in Silicon (Si), and therefore the objects may conveniently be termed ASilicon Objects@ (Trademark), the IC 5 may be implemented in any suitable materials systems.

What is claimed is:

1. An integrated circuit comprising:
   a plurality of logic areas, the plurality of logic areas comprising an array of logic-gates or logic-blocks or custom logic which form functional blocks; and
   an actively switchable network selectively connecting one logic area with another logic area;
   wherein the integrated circuit provides a chip-architecture where the functional blocks are specific hardware functional blocks, hardware functional blocks that are parameterized, and/or programmable functional blocks including programmable processors; and
   further wherein the functional blocks act as objects requesting and providing services to other objects on the actively switchable network, and when a functional block is a programmable processor the functional block optionally implements objects, the programmable processor making one, some or all objects thereof visible to other objects connected to the actively switchable network.

2. The integrated circuit of claim 1, wherein the integrated circuit provides a particular object or logic that is responsible for receiving requests for services and for providing an address of an object that provides the required service.

3. The integrated circuit of claim 1, wherein the integrated circuit provides at least one client object and at least one service object each of predetermined location which are fixed.

4. The integrated circuit of claim 1, wherein locations of objects are determined when the objects are loaded into field programmable gate arrays (FPGA), or at least one programmable processor, loader circuitry applying where objects are to be placed on a target device, a map being used to specify connections between objects whilst loading.

5. The integrated circuit of claim 1, wherein objects are loaded onto a target device without interconnection therebetween and, in use, when a client object requires a service other objects are broadcast a request to provide such a service, service objects capable of providing the service responding to the client object, and a service object selected as the chosen service object by the client object, and interconnection defined between the client object and chosen service object.

6. The integrated circuit of claim 1, wherein objects are loaded onto a target device without interconnection therebetween and, in use, objects broadcast services which can be provided and other objects record a location of the objects providing services which will be required.

7. The integrated circuit of claim 1, wherein the integrated circuit provides an object cache where an object is loaded temporarily when required to perform a service and moved to an external memory when services are no longer required.

8. The integrated circuit of claim 7, wherein an object cache operates with a fixed set of functional blocks held permanently in the object cache and where specific instances are held in external memory and loaded when needed.

9. The integrated circuit of claim 8, wherein instance memory that holds only instances of a particular object type is provided adjacent to the functional block implementing that particular type of object.

10. The integrated circuit of claim 7, wherein there is provided a plurality of object cache controllers.

11. The integrated circuit of claim 1, wherein the integrated circuit provides an object cache where an object is loaded temporarily over an external network when required to perform a service and means for returning the object over the external network when services are no longer required.

12. The integrated circuit of claim 1, wherein the integrated circuit is fabricated in a semi-conductor material such as Silicon (Si).

13. The integrated circuit of claim 1, wherein a given logic area comprises a single physical area of the integrated circuit or comprises a plurality of discrete areas of the integrated circuit.

14. The integrated circuit of claim 1, wherein the actively switchable network comprises an on-chip packet switching network.

15. The integrated circuit of claim 14, wherein the packet-switching network includes interfaces for connecting functional blocks to the network, routing switches, and point-to-point links between interfaces and routing switches and between routing switches and other routing switches.

16. The integrated circuit of claim 1, wherein signals are effectively connected between functional blocks by taking a present value of one or more signals at a source functional block, packing these value(s) as data into a packet cargo and sending a packet across the on-chip network, a header for the packet being set to contain a location of a destination functional block, and when the packet arrives at a destination, appropriate signals within the destination functional block are set to values defined in the packet cargo.

17. The integrated circuit of claim 16, wherein each network interface contains a means of packing signals into packets, a transmitter for sending packets, a receiver for receiving packets and a means of extracting signal(s) from the packet.

18. The integrated circuit of claim 16, wherein the packet-switching network transports packets from an interface connected to signal source(s), across selected links and routing switches making up the network, to an interface connected to a signal destination functional block, each packet comprising a header, a cargo and a delimiter, the header defining a location of the destination for the packet, the cargo containing data or signal values to be sent across the network, the delimiter separating one packet from another.

19. The integrated circuit of claim 18, wherein packets are delimited by a start of packet marker or by an end of packet marker, the start of packet marker and/or end of packet marker being special codes added by a link transmitter at a start or end of a packet that a link receiver recognizes.

20. The integrated circuit of claim 18, wherein packets are sent without a delimiter in which case either packets are of a known fixed length or information is added to a packet header, which details a length of a packet.

21. The integrated circuit of claim 18, wherein where there is more than one link connecting a pair of routing switches, the links comprise equivalent routes for a packet, so any one of the links may be used to forward a packet, such that when a new packet arrives at a routing switch to be sent to a particular destination, if one link is already busy sending another packet then the new packet can be sent out of one of the other equivalent links.

22. The integrated circuit of claim 18, wherein the actively switchable network is selected from a construction comprising:
   a network that switches packets of information using routing switches arranged in a substantially regular grid;
   a network that switches packets of information using routing switches arranged irregularly;
   a network that uses a physical location of a destination logic area to determine the routing through the network;
   a network that uses a name of the destination logic area to determine routing through the network where each routing switch has a look up table to translate from the name to an output port that a packet is to be forwarded through;
   a network where packet destinations are specified as a route or collection of possible routes through the network;
   a network where packets are sent from one routing switch to a next in a ring or loop eventually returning back to a source of the packet, wherein a user logic area accepting the packet removes the packet from the loop, and the accepting user logic area puts a reply onto the loop so that it moves on round the loop until it arrives back at a source of the original packet where it is received and removed from the loop; or
   a network which uses a combination of routing switch arrays and loops.

23. The integrated circuit of claim 1, wherein different functional blocks operate asynchronously or synchronously one with the other.

24. The integrated circuit of claim 23, wherein when operating asynchronously, a source functional block requests a service from another functional block by sending the another functional block a message, and the source functional block suspends operation until the source functional block receives a response from a requested service or the source functional block continues doing other operations until the source functional block can proceed no further without a response, when a message arrives at the another functional block or a target block providing the requested service, the service is actioned and the response returned to the functional block that requested the service, the source functional block then continues with its operation, requesting and providing services to other blocks as necessary.

25. The integrated circuit of claim 24, wherein the functional blocks operate asynchronously with synchronization between blocks occurring only when some exchange of information has to take place.

26. The integrated circuit of claim 23, wherein when operating synchronously, signal values are transferred from a source functional block to a destination functional block and be held in a synchronization register, a synchronization signal then updates the destination functional block with new signal values and packets of signal values are sent to appropriate destinations from all sources that have modified their output values since the last synchronization signal.

27. The integrated circuit of claim 26, wherein operation comprises the steps of:
   (1) on receiving a synchronization signal all input signals are updated with new values from the synchronization register, (2) each logic block propagates these new input signals through to produce an output signal, (3) the new output signal values are put in packets and sent to required destination blocks, and (4) the synchronization signal is asserted and the process continues.

28. The integrated circuit of claim 27, wherein a single synchronization signal synchronizes a plurality of logic blocks, computation and distribution of new signal values being complete before a next time the synchronization signal is asserted.

29. The integrated circuit of claim 27, wherein several different synchronization signals are used, with a period of the synchronization signal being matched to a required performance of each logic block, the synchronization period being long enough to allow all the relevant signals and data to be transferred in packets to their required destinations before the next synchronization signal.

30. The integrated circuit of claim 1, wherein the integrated circuit provides a chip architecture including an actively switchable network which is extended off-chip to provide for inter-chip communication, an off-chip extension of the on-chip network using single-ended or differential signalling for a link between the chip and another chip(s), the off-chip extension incorporating error correction/detection coding within each packet.

31. The integrated circuit of claim 1, wherein the integrated circuit provides a chip architecture in which an interface to the functional-blocks takes the form of an operation identifier, followed by a set of parameters, each functional block implementing one or more operations, the operation identifier selecting which operation a functional-block is to perform, the set of parameters containing those pieces of information that an operation requires in order to fulfill a task thereof; distinct functional-blocks or "objects" with well-defined functionality, collaborating to provide required system-level functionality, each object providing specific functionality, defined by the operations supported thereby, collaboration between the objects being supported by message passing between objects to allow one object to request an operation or service from another object, the infrastructure to support message passing being provided by the on-chip network, operation requests and associated parameters being transformed by the network interface to the signals and data values that the functional-block (object) needs to carry out the requested operation.

32. The integrated circuit of claim 31, wherein a message is either a service request or a reply to a service request, a service request message comprising source and destination object identifiers, operation identifier, and parameters, a reply comprising source and destination identifiers, operation identifier and result data or acknowledgement.

33. The integrated circuit of claim 32, wherein each message is placed in a single packet or a message is split over several smaller packets.

34. The integrated circuit of claim 1, wherein programmable processors that execute out of local cache memory obtaining program code and/or data via the on-chip network from other memory areas when there is a cache miss.

35. The integrated circuit of claim 1, wherein error detection or correction is added to data/control characters or packets to improve reliability in situations where there are single event upsets within the chip.

36. The integrated circuit of claim 1, wherein to reduce power consumption a link is stopped when the said link no longer has any information to send, the link only sending data or control characters when there are characters to send otherwise it is not active.

37. An integrated circuit providing a plurality of interconnections between distinct defined areas of the integrated circuit, each interconnection comprising one or more serial links, each serial link having at one end thereof means for transmitting a plurality of parallel signals serially along the said serial link, and at another end thereof means for receiving the serially transmitted plurality of parallel signals, wherein further the integrated circuit provides means for reconstructing the plurality of parallel signals from the serially transmitted plurality of parallel signals.

38. A system or an apparatus including an integrated circuit comprising:

a plurality of logic areas, the plurality of logic areas comprising an array of logic-gates or logic-blocks or custom logic which form functional blocks; and an actively switchable network selectively connecting one logic area with another logic area;

wherein the integrated circuit provides a chip-architecture where the functional blocks are specific hardware functional blocks, hardware functional blocks that are parameterized, and/or programmable functional blocks including programmable processors; and further wherein the functional blocks act as objects requesting and providing services to other objects on the actively switchable network, and when a functional block is a programmable processor the functional block optionally implements objects, the programmable processor making one, some or all objects thereof visible to other objects connected to the actively switchable network.

39. An assembly comprising at least two integrated circuits and means for transferring data between the at least two integrated circuits, wherein the at least two integrated circuits each comprises:

a plurality of logic areas, the plurality of logic areas comprising an array of logic-gates or logic-blocks or custom logic which form functional blocks; and an actively switchable network selectively connecting one logic area with another logic area;

wherein the integrated circuit provides a chip-architecture where the functional blocks are specific hardware functional blocks, hardware functional blocks that are parameterized, and/or programmable functional blocks including programmable processors; and further wherein the functional blocks act as objects requesting and providing services to other objects on the actively switchable network, and when a functional block is a programmable processor the functional block optionally implements objects, the programmable processor making one, some or all objects thereof visible to other objects connected to the actively switchable network.

40. A method of communication within an integrated circuit comprising the steps of:

providing an integrated circuit comprising:

a plurality of logic areas, the plurality of logic areas comprising an array of logic-gates or logic-blocks or custom logic which form functional blocks; and an actively switchable network selectively connecting one logic area with another logic area;

wherein the integrated circuit provides a chip-architecture where the functional blocks are specific hardware functional blocks, hardware functional blocks that are parameterized, and/or programmable functional blocks including programmable processors; and further wherein the functional blocks act as objects requesting and providing services to other objects on the actively switchable network, and when a functional block is a programmable processor the functional block optionally implements objects, the programmable processor making one, some or all objects thereof visible to other objects connected to the actively switchable network;

selecting a source logic area from the plurality of logic areas;

selecting a destination logic area from the plurality of logic areas;

encoding data from the source logic area as a data packet;

transmitting said data packet from the source logic area to the destination logic area via actively switchable network; and decoding the data at the destination logic area from the data packet.

* * * * *